United States Patent
Imamura

(10) Patent No.: US 9,473,103 B2
(45) Date of Patent: Oct. 18, 2016

(54) HIGH FREQUENCY COMPONENT

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/338,632

(22) Filed: Jul. 23, 2014

(65) Prior Publication Data

US 2015/0061791 A1 Mar. 5, 2015

(30) Foreign Application Priority Data

Aug. 28, 2013 (JP) ................................. 2013-177118

(51) Int. Cl.
  *H03H 7/09* (2006.01)
  *H03H 7/01* (2006.01)
  *H03H 1/00* (2006.01)

(52) U.S. Cl.
  CPC .............. *H03H 7/09* (2013.01); *H03H 7/0115* (2013.01); *H03H 7/1708* (2013.01); *H03H 7/1775* (2013.01); *H03H 2001/0085* (2013.01)

(58) Field of Classification Search
  CPC .................. H03H 2001/0085; H03H 7/0115; H03H 7/09; H03H 7/1775; H03H 7/1708
  USPC ................ 333/168, 175, 176, 185; 363/200; 361/306.3; 336/200
  See application file for complete search history.

(56) References Cited

U.S. PATENT DOCUMENTS

| | | | |
|---|---|---|---|
| 6,222,427 B1 | 4/2001 | Kato et al. | |
| 6,252,761 B1* | 6/2001 | Branchevsky | .... H01L 23/49822 257/E23.062 |
| 8,159,314 B1* | 4/2012 | Estes | ................... H01P 1/20345 333/202 |
| 2007/0241839 A1* | 10/2007 | Taniguchi | ................ H03H 7/09 333/185 |
| 2009/0033439 A1* | 2/2009 | Igarashi | ............... H03H 7/0115 333/185 |
| 2010/0171568 A1* | 7/2010 | Taniguchi | ............ H03H 7/0115 333/176 |

FOREIGN PATENT DOCUMENTS

| | | |
|---|---|---|
| EP | 2 009 787 A1 | 12/2008 |
| JP | 9-35936 A | 2/1997 |
| JP | 2006-54207 A | 2/2006 |
| JP | 2006-311203 A | 11/2006 |
| JP | 2009-153106 A | 7/2009 |
| JP | 2011-244504 A | 12/2011 |
| WO | 2007/119356 A1 | 10/2007 |

OTHER PUBLICATIONS

Official Communication issued in corresponding Japanese Patent Application No. 2013-177118, mailed on Jun. 30, 2015.

* cited by examiner

*Primary Examiner* — Robert Pascal
*Assistant Examiner* — Rakesh Patel
(74) *Attorney, Agent, or Firm* — Keating & Bennett, LLP

(57) ABSTRACT

A high frequency component includes transverse inductors each including a first end and a second end and capacitors including planar conductors connected to the first ends of the transverse inductors, planar conductors connected to the second ends of the transverse inductors, and insulating layers disposed between the planar conductors. Each of the transverse inductors is helical and wound at least more than one turn.

15 Claims, 15 Drawing Sheets

HIGH FREQUENCY COMPONENT

BACKGROUND OF THE INVENTION

1. Field of the Invention

The present invention relates to a high frequency component including an LC resonant circuit disposed inside a multilayer body including stacked insulating layers.

2. Description of the Related Art

A component including an LC resonant circuit disposed in a multilayer body is used as a high frequency component. Such a high frequency component is expected to improve the Q value of the LC resonant circuit while reducing the size of the multilayer body.

An inductor in the LC resonant circuit may be made of a conductive pattern having a loop shape inside the multilayer body. In that case, it is known that the Q value of the LC resonant circuit is improved by an increase in the loop diameter. However, the increase in the loop diameter of the inductor leads to an increase in the size of the multilayer body. Thus, there is a limit to an amount of improvement in the Q value of the LC resonant circuit by the increase in the loop diameter of the inductor.

As the inductor, a transverse inductor may be configured in which an interlayer connection conductor and a linear conductor are disposed in a loop whose center is on a winding axis extending along a direction perpendicular or substantially perpendicular to the stacking direction of the insulating layers in a plane substantially perpendicular to the winding axis (see, for example, Japanese Unexamined Patent Application Publication No. 2011-244504). Because the interlayer connection conductor constitutes a part of the loop of the transverse inductor, the inductor has a lower resistance than that in an inductor entirely made of a linear conductor. Accordingly, the use of such a transverse inductor as the inductor in the LC resonant circuit enables improvement in the Q value of the LC resonant circuit.

To attain a higher inductance in the transverse inductor, it is necessary to increase the loop diameter. That increase leads to an increase in the length of the interlayer connection conductor disposed in the stacking direction in the multilayer body. Thus, it is difficult to both reduce the profile of the multilayer body and increase the inductance. In particular, to make the LC resonant circuit support a lower frequency range, it is necessary to further increase the inductance of the transverse inductor. In that case, reducing the profile of the high frequency component is significantly difficult.

SUMMARY OF THE INVENTION

Accordingly, preferred embodiments of the present invention provide a high frequency component capable of both improving the Q value of an LC resonant circuit including a transverse inductor and increasing an inductance without increasing the thickness of a multilayer body.

According to a preferred embodiment of the present invention, a high frequency component includes a multilayer body including a plurality of insulating layers stacked on each other, planar conductors extending along surfaces of the insulating layers, linear conductors extending along the surfaces of the insulating layers, interlayer connection conductors extending through at least one of the insulating layers, at least one transverse inductor, and at least one capacitor. The at least one transverse inductor includes a first end and a second end, including the linear conductors and the interlayer connection conductors that are connected between the first end and the second end, and being wound along a winding axis direction perpendicular or substantially perpendicular to a stacking direction of the insulating layers. The at least one capacitor includes a first planar conductor connected to the first end of the transverse inductor, a second planar conductor connected to the second end of the transverse inductor, and at least one of the insulating layers that is disposed between the first planar conductor and the second planar conductor. The transverse inductor is helical and wound at least more than one turn.

In the description below, one turn of a transverse inductor is defined as one in which an interlayer connection conductor, a linear conductor, another interlayer connection conductor, and another linear conductor are connected in this order in a loop or as one in which a linear conductor, an interlayer connection conductor, another linear conductor, and another interlayer connection conductor are connected in this order in a loop.

In this configuration, an LC resonant circuit is configured to include the helical transverse inductor disposed inside the multilayer body, and thus the Q value of the LC resonant circuit is improved. In addition, the dimensions of the multilayer body in the stacking direction are smaller than those in a loop inductor wound in only a single plane.

The at least one transverse inductor and the at least one capacitor may preferably include a plurality of transverse inductors and a plurality of capacitors defining a plurality of LC resonant circuits. The winding axis directions in the transverse inductors in the plurality of LC resonant circuits may preferably be parallel or substantially parallel to each other. When seen along the winding axis directions, winding ranges defined by the linear conductors and the interlayer connection conductors may preferably overlap each other at least in part. Thus, the coupling between the LC resonant circuits is adjusted by adjustment of the area of an overlap of the winding ranges of the transverse inductors and the intervals thereof along the winding axes. That makes it easy to set an attenuation pole and a bandwidth in the filter characteristic.

The high frequency component may further include input and output terminals and a ground terminal disposed on an outer surface of the multilayer body. In at least one set of the transverse inductors being next to each other in the winding axis directions, their first ends may be connected to the input and output terminals, their second ends may be connected to the ground terminal, and their second ends may be adjacent to each other inside the multilayer body. Alternatively, their first ends may be adjacent to each other inside the multilayer body.

When one set of the transverse inductors being next to each other in the winding axis directions are arranged such that their second ends near the ground terminal are adjacent to each other, the degree of coupling over magnetic fields between the transverse inductors is strengthened. When one set of the transverse inductors being next to each other in the winding axis directions are arranged such that their first ends near the input and output terminals are adjacent to each other, the degree of coupling over magnetic fields between the transverse inductors is weakened. Accordingly, the degree of coupling between the transverse inductors is preferably set by determining the orientations of both ends of each of the transverse inductors inside the multilayer body.

The first planar conductor or the second planar conductor may preferably be disposed on the surface of the same insulating layer as that on which the linear conductor being a part of the transverse inductor is disposed. With this configuration, the number of the insulating layers stacked in the multilayer body is reduced.

The second planar conductor may preferably be a ground conductor electrically connected to the ground terminal and may preferably be in a location opposite the transverse inductor. The first planar conductor may preferably be disposed between the transverse inductor and the second planar conductor inside the multilayer body. Thus, a parasitic capacitance occurring between the transverse inductor and the ground conductor is significantly reduced or prevented.

The high frequency component may further include a coupling inductor or a coupling capacitor to provide coupling between the plurality of LC resonant circuits or between any one of the plurality of LC resonant circuits and either one of the input and output terminals. Thus, the range of adjustment of the degree of coupling between the multiple stages of LC resonant circuits is widened.

When seen along the winding axis directions, the coupling inductor or the coupling capacitor may preferably be disposed within the winding ranges of the transverse inductors. Thus, the multilayer body is further miniaturized, and the loop diameter of the transverse inductor is increased.

The linear conductor included in the transverse inductor may preferably include a plurality of linear conductors disposed on two or more of the insulating layers such that the linear conductors overlap each other when seen along the stacking direction of the insulating layers, and the plurality of linear conductors may preferably be connected in parallel to each other with the interlayer connection conductors. Thus, the linear conductors in the transverse inductor preferably has a multilayer structure, the effective cross-sectional area of the linear conductors is increased, and the transverse inductor has a low resistance. Accordingly, the Q value of the LC parallel resonant circuit is further increased.

The insulating layer between the first planar conductor and the second planar conductor may preferably have a relative permittivity higher than that of another insulating layer. Thus, a capacitance of the capacitor in the LC resonant circuit is increased, the area of electrodes is reduced, and a parasitic capacitance occurring between the capacitor and the transverse inductor in the LC resonant circuit is significantly reduced or prevented.

In accordance with the high frequency component according to a preferred embodiment of the present invention, the inductor in the LC resonant circuit is configured as a helical transverse inductor, and thus an increase in the dimensions in the multilayer body in the stacking direction is significantly reduced or prevented and the Q value of the LC resonant circuit is improved while a high inductance is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A high frequency component according to a first preferred embodiment of the present invention is described below. A high frequency component preferably used as a high frequency filter having a band pass filter characteristic having cutoff frequency bands higher and lower than a pass band is described here as an example.

Figure 1:
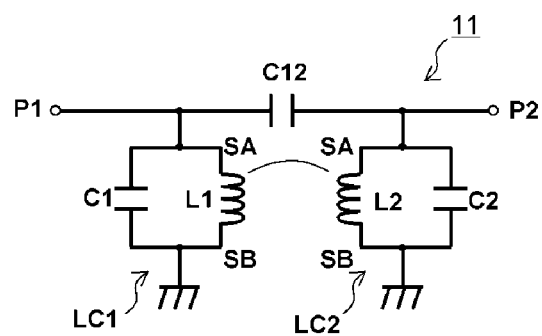
FIG. 1 is an equivalent circuit diagram of a high frequency component according to a first preferred embodiment of the present invention.

FIG. 1 is an equivalent circuit diagram of a high frequency component 11 according to the first preferred embodiment. The high frequency component 11 preferably defines and functions as a band pass filter including input and output terminals P1 and P2, capacitors C1, C2, and C12, and inductors L1 and L2.

Each of the inductors L1 and L2 includes a first end SA connected to the input and output terminals P1 and P2 and a second end SB connected to a ground terminal. The capacitor C1 is connected in parallel to the inductor L1, and they constitute a resonant circuit LC1. Similarly, the capacitor C2 is connected in parallel to the inductor L2, and they constitute a resonant circuit LC2.

The capacitor C12 is connected between the resonant circuits LC1 and LC2. The capacitor C12 is a coupling capacitor configured to establish capacitive coupling between the resonant circuits LC1 and LC2. The inductors L1 and L2 in the resonant circuits LC1 and LC2 are inductively coupled to each other.

The resonant circuit LC1 is directly connected to the input terminal P1 and is an input-stage resonant circuit. The resonant circuit LC2 is directly connected to the output terminal P2 and is an output-stage resonant circuit. The above-described circuitry portion constitutes a band pass filter in which two-stage parallel resonant circuits are coupled between the input and output terminals P1 and P2.

Figure 2A:
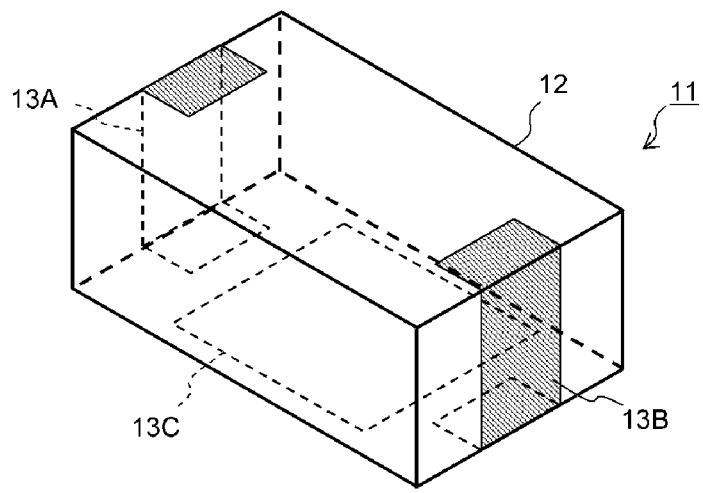
FIGS. 2A, 2B, and 2C are a perspective view, an equivalent perspective view, and a side cross-sectional view, respectively, of the high frequency component according to the first preferred embodiment of the present invention.

FIG. 2A is a perspective view of the high frequency component 11 according to the first preferred embodiment. The high frequency component 11 includes a multilayer body 12 having a rectangular or substantially rectangular parallelepiped shape.

In the following description, the surface on the near left side of the multilayer body 12 illustrated in FIG. 2A is referred to as the front surface, the surface on the far right side of the multilayer body 12 is referred to as the back surface, the surface on the near right side of the multilayer body 12 is referred to as the right side surface, and the surface on the far left side of the multilayer body 12 is referred to as the left side surface.

The multilayer body 12 includes a plurality of insulating layers stacked in a stacking direction perpendicular or substantially perpendicular to the lower surface and the upper surface. The insulating layers in the multilayer body 12 may be made of, for example, a resin material, such as thermoplastic resin, or a ceramic material, such as low temperature co-fired ceramic.

Input and output terminals 13A and 13B and a ground terminal 13C are disposed on the outer surface of the multilayer body 12. The input and output terminal 13A corresponds to the input terminal P1 in FIG. 1 and extends from the upper surface to the lower surface through the left side surface of the multilayer body 12. The input and output terminal 13B corresponds to the output terminal P2 in FIG. 1 and extends from the upper surface to the lower surface through the right side surface of the multilayer body 12. The ground terminal 13C is disposed on the lower surface of the multilayer body 12.

Figure 2B:
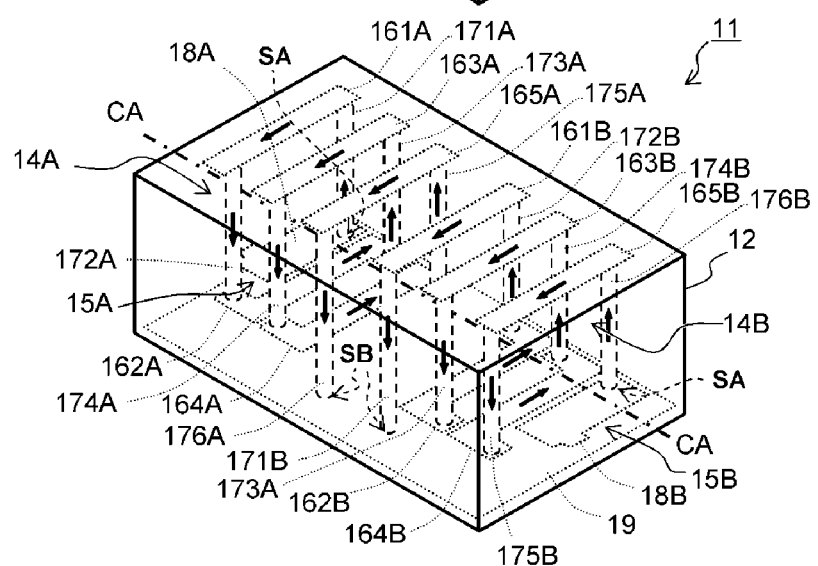

FIG. 2B is a transparent perspective view of the high frequency component 11 according to the first preferred embodiment.

Linear conductors 161A, 162A, 163A, 164A, 165A, 161B, 162B, 163B, 164B, and 165B extending in a direction perpendicular or substantially perpendicular to the stacking direction of the insulating layers and planar conductors 18A, 18B, and 19 expanding in a plane direction of the insulating layers are disposed inside the multilayer body 12. Each of the linear conductors 161A to 165A and 161B to 165B and the planar conductors 18A, 18B, and 19 may be made of, for example, a sintered body of conductive paste formed by printing or copper foil patterned by a photolithographic process.

Interlayer connection conductors 171A, 172A, 173A, 174A, 175A, 176A, 171B, 172B, 173B, 174B, 175B, and 176B extend through the insulating layers in the multilayer body 12 in the stacking direction. Each of the interlayer connection conductors 171A to 176A and 171B to 176B may be formed by sintering conductive paste filled in a via hole formed in each of the insulating layers, for example.

The linear conductors 161A to 165A and the interlayer connection conductors 171A to 176A constitute a transverse inductor 14A. The linear conductors 161B to 165B and the interlayer connection conductors 171B to 176B constitute a transverse inductor 14B. The planar conductors 18A and 19 constitute a capacitor 15A. The planar conductors 18B and 19 constitute a capacitor 15B. The transverse inductors 14A and 14B and the capacitors 15A and 15B are disposed inside the multilayer body 12.

The transverse inductor 14A corresponds to the inductor L1 in FIG. 1, is arranged between the left side surface and the center inside the multilayer body 12, and is configured such that the interlayer connection conductor 171A, the linear conductor 161A, the interlayer connection conductor 172A, the linear conductor 162A, the interlayer connection conductor 173A, the linear conductor 163A, the interlayer connection conductor 174A, the linear conductor 164A, the interlayer connection conductor 175A, the linear conductor 165A, and the interlayer connection conductor 176A are connected in this order from the first end SA located near the left side surface of the multilayer body 12 toward the second end SB located near the center of the multilayer body 12. Thus, the transverse inductor 14A is wound around a winding axis CA extending in a direction perpendicular or substantially perpendicular to the stacking direction of the insulating layers in the multilayer body 12, here, extending in a direction connecting the left side surface and the right side surface of the multilayer body 12 and has a right-handed screw shape (right-handed helical shape) extending along the winding axis CA from the first end SA toward the second end SB.

The transverse inductor 14B corresponds to the inductor L2 in FIG. 1, is arranged between the right side surface and the center inside the multilayer body 12, and is configured such that the interlayer connection conductor 176B, the linear conductor 165B, the interlayer connection conductor 175B, the linear conductor 164B, the interlayer connection conductor 174B, the linear conductor 163B, the interlayer connection conductor 173B, the linear conductor 162B, the interlayer connection conductor 172B, the linear conductor 161B, and the interlayer connection conductor 171B are connected in this order from the first end SA located near the right side surface of the multilayer body 12 toward the second end SB located near the center of the multilayer body 12. Thus, the transverse inductor 14B is wound around the winding axis CA and has a left-handed screw shape (left-handed helical shape) extending along the winding axis CA from the first end SA toward the second end SB.

As described above, each of the transverse inductors 14A and 14B includes approximately 2+(¾) turns of connected interlayer connection conductors and linear conductors. One turn of each of the transverse inductors 14A and 14B is the one in which two interlayer connection conductors and two linear conductors are connected in a loop. Such a configuration in which each of the transverse inductors 14A and 14B has a helical shape in which the interlayer connection conductors and linear conductors of at least more than one turn are connected achieves an inductance higher than that when it is a loop wound in only one plane. Even when the high inductance is achieved, an increase in the dimensions of the multilayer body 12 in the stacking direction is prevented.

Figure 2C:
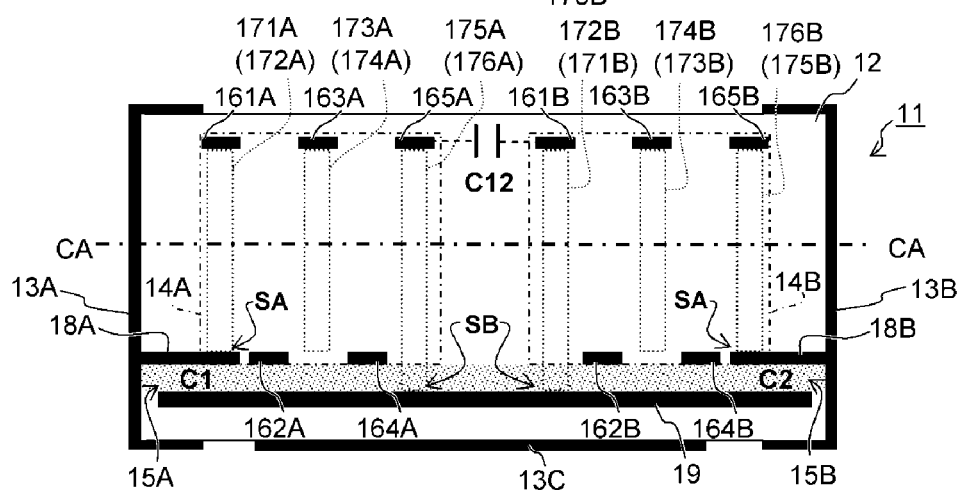

FIG. 2C is a cross-sectional view illustrating the arrangement of the transverse inductors 14A and 14B and the capacitors 15A and 15B in the multilayer body 12 and illustrates a cross section of the multilayer body 12 at a plane parallel or substantially parallel to the front surface and the back surface of the multilayer body 12.

The capacitor 15A corresponds to the capacitor C1 in FIG. 1 and is one in which the first planar conductor 18A and the second planar conductor 19 are opposite each other such that an insulating layer is disposed therebetween. The first planar conductor 18A is on the same layer where the linear conductors 162A and 164A, which define the lower surface of the transverse inductor 14A, are disposed. Thus, the number of the insulating layers in the multilayer body 12 is significantly reduced. The first planar conductor 18A is near the left side of the transverse inductor 14A, is connected to the first end SA near the left side of the transverse inductor 14A, and is connected to the input and output terminal 13A on the left side surface of the multilayer body 12.

The capacitor 15B corresponds to the capacitor C2 in FIG. 1 and is one in which the first planar conductor 18B and the second planar conductor 19 are opposite each other such that an insulating layer is disposed therebetween. The first planar conductor 18B is on the same layer where the linear conductors 162B and 164B, which define the lower surface of the transverse inductor 14B, are disposed. Thus, the number of the insulating layers in the multilayer body 12 is significantly reduced. The first planar conductor 18B is near the right side of the transverse inductor 14B, is connected to the first end SA near the right side of the transverse inductor 14B, and is connected to the input and output terminal 13B on the right side surface of the multilayer body 12.

The second planar conductor (ground conductor) 19 is connected to the ground terminal 13C on the lower surface of the multilayer body 12 such that an interlayer connection conductor (not illustrated) is disposed therebetween. The ground conductor 19 is below the transverse inductors 14A and 14B in the multilayer body 12. When the multilayer body 12 is seen from the upper surface side, the ground conductor 19 overlaps the transverse inductors 14A and 14B and the planar conductors 18A and 18B in the capacitors 15A and 15B. This prevents the filter characteristic of the high frequency component 11 from being affected by coupling of conductive patterns on an external substrate on which the high frequency component 11 is implemented to the conductive patterns inside the high frequency component 11. Because the ground conductor 19 is the second planar conductor included in each of the capacitors 15A and 15B, the multilayer body 12 has a reduced number of insulating layers. The ground conductor 19 is connected to the second end SB near the right side of the transverse inductor 14A (near the center of the multilayer body) and the second end SB near the left side of the transverse inductor 14B (near the center of the multilayer body) in the vicinity of the center of the portion between the transverse inductors 14A and 14B in the multilayer body 12.

The capacitor C12 configured to provide capacitive coupling in FIG. 1 has capacitance produced by the state where the linear conductors and the interlayer connection conductors in the transverse inductor 14A and the linear conductors and the interlayer connection conductors in the transverse inductor 14B are opposite each other along the winding axis CA.

When the multilayer body 12 is seen along the winding axis CA in a transparent manner, the transverse inductors 14A and 14B are arranged such that their winding ranges of the transverse inductors 14A and 14B overlap each other. The winding ranges may overlap each other in whole or in part.

The direction from the input and output terminals 13A and 13B toward the ground conductor 19 in the transverse inductor 14A in the combinations of the linear conductors and the interlayer connection conductors being opposite each other along the winding axis CA is the same as the direction from the input and output terminals 13A and 13B toward the ground conductor 19 in the transverse inductor 14B in the combinations of the linear conductors and the interlayer connection conductors being opposite each other along the winding axis CA. The direction from the input and output terminals 13A and 13B toward the ground conductor 19 is indicated by the arrows as a signal propagation direction in FIG. 2B. When the transverse inductors having the same signal propagation directions are next to each other, the directions of magnetic fluxes occurring in their winding ranges are the same, and the inductors are inductively coupled to each other in a direction in which the magnetic fluxes strengthen each other (positively coupled).

The transverse inductors 14A and 14B are arranged such that their second ends SB, which are connected to the ground conductor 19, are adjacent to each other in the vicinity of the center of the multilayer body 12. Thus, the inductive coupling between the transverse inductors 14A and 14B is stronger than that when the transverse inductors 14A and 14B are arranged such that the first end SA of one of them and the second end SB of the other one are adjacent to each other.

One of the transverse inductors 14A and 14B may be wound such that the signal propagation direction indicated by the arrows in FIG. 2B is reversed. In that case, the magnetic fluxes occurring in the winding ranges of the transverse inductors 14A and 14B extend in opposite directions, and the transverse inductors 14A and 14B are inductively coupled to each other in a direction in which the magnetic fluxes weaken each other (negatively coupled). In that case, the arrangement in which the second ends SB, which are near the ground conductor 19, in the transverse inductors 14A and 14B are adjacent to each other enhances the degree of the negative coupling.

In the above-described high frequency component 11, a band pass filter having a high degree of the inductive coupling between the resonant circuits LC1 and LC2 is configured. Because the transverse inductors 14A and 14B including interlayer connection conductors are used in the resonant circuits LC1 and LC2, the filter characteristic (pass band characteristic) of the band pass filter has a high Q value. Because the helical transverse inductors 14A and 14B are used, even when high inductances are achieved in the transverse inductors 14A and 14B, an increase in the dimensions of the multilayer body 12 in the stacking direction is prevented.

In the multilayer body 12, the insulating layer between the planar conductors in each of the capacitors 15A and 15B (dotted insulating layer in FIG. 2C) has a relative permittivity higher than that in another insulating layer. That is, the portion between the two planar conductors in each of the capacitors 15A and 15B has a high relative permittivity. Thus, the capacitance is increased while the opposed area of the planar conductors included in each of the capacitors 15A and 15B is significantly reduced, and parasitic capacitances occurring between the capacitors 15A and 15B and the transverse inductors 14A and 14B are significantly reduced or prevented.

Figure 3A:
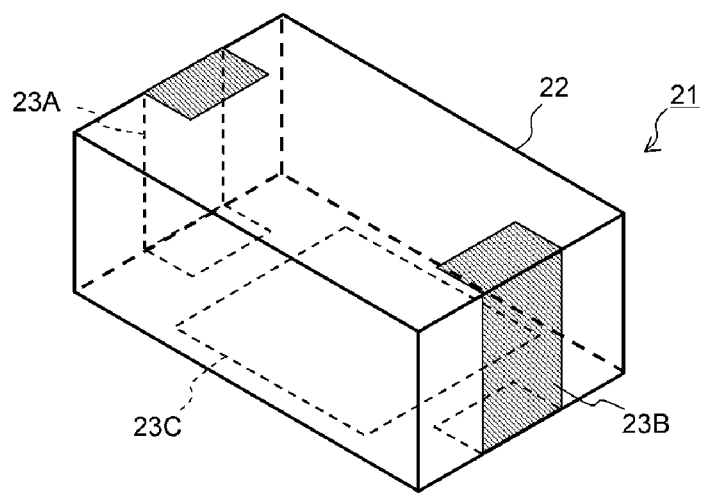
FIGS. 3A, 3B, and 3C are a perspective view, an equivalent perspective view, and a side cross-sectional view, respectively, of a high frequency component according to a second preferred embodiment of the present invention.
Figure 3B:
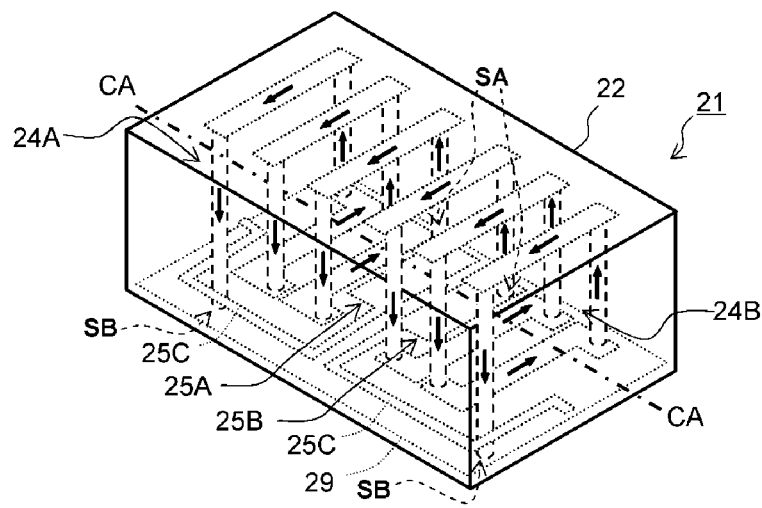

Next, a high frequency component 21 according to a second preferred embodiment of the present invention is described. The high frequency component 21 according to the second preferred embodiment is a variation of the high frequency component according to the first preferred embodiment. FIG. 3A is a perspective view of the high frequency component 21 according to the second preferred embodiment. FIG. 3B is a transparent perspective view of the high frequency component 21 according to the second preferred embodiment.

The high frequency component 21 includes a multilayer body 22 having a rectangular or substantially rectangular parallelepiped shape. Input and output terminals 23A and 23B and a ground terminal 23C are disposed on the outer surface of the multilayer body 22. The multilayer body 22, the input and output terminals 23A and 23B, and the ground terminal 23C preferably have the same or substantially the same configurations as those in the multilayer body, the input and output terminals, and the ground terminal in the first preferred embodiment. Transverse inductors 24A and 24B including linear conductors and interlayer connection conductors and capacitors 25A and 25B including planar conductors are disposed inside the multilayer body 22.

The transverse inductor 24A is disposed between the center and the left side surface of the multilayer body 22 and has a left-handed screw shape (left-handed helical shape) extending from the first end SA located near the center of the multilayer body 22 toward the second end SB near the left side surface of the multilayer body 22. The transverse inductor 24B is disposed between the center and the right side surface of the multilayer body 22 and has a right-handed screw shape (left-handed helical shape) extending from the first end SA located near the center of the multilayer body 22 toward the second end SB near the right side surface of the multilayer body 22. Here, each of the transverse inductors 24A and 24B includes approximately 2+(¾) turns of connected interlayer connection conductors and linear conductors. One turn of each of the transverse inductors 24A and 24B is the one in which two interlayer connection conductors and two linear conductors are connected in a loop.

Figure 3C:
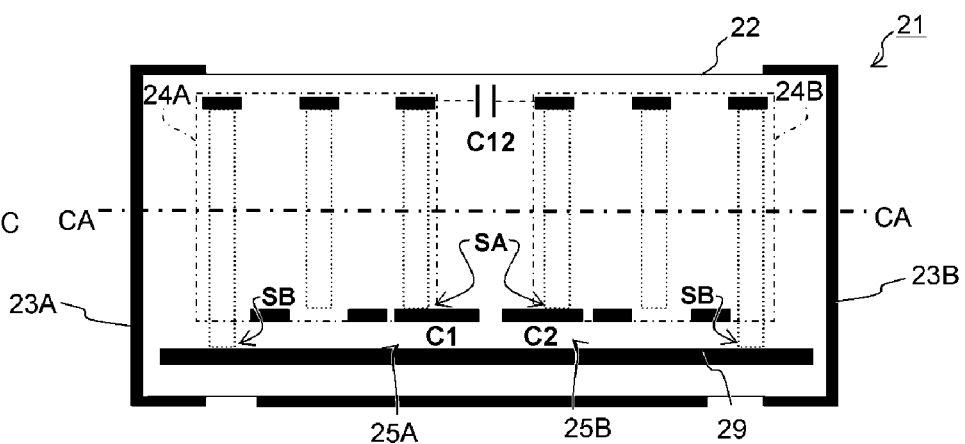

FIG. 3C is a cross-sectional view illustrating the arrangement of the transverse inductors 24A and 24B and the capacitors 25A and 25B in the multilayer body 22 and illustrates a cross section of the multilayer body 22 at a plane parallel or substantially parallel to the front surface and the back surface of the multilayer body 22.

The capacitors 25A and 25B are disposed between the transverse inductors 24A and 24B. Specifically, the capacitor 25A is near the right side of the transverse inductor 24A, and the capacitor 25B is near the left side of the transverse inductor 24B. The first planar conductor included in the capacitor 25A is connected to the first end SA near the right side of the transverse inductor 24A (near the center of the multilayer body), is extended to the left side surface of the multilayer body 22 by an extended line 25C routed on the surface of the same insulating layer as that on which the first planar conductor of the capacitor 25A is disposed, and is connected to the input and output terminal 23A. The first planar conductor included in the capacitor 25B is connected to the first end SA near the left side of the transverse inductor 24B (near the center of the multilayer body), is extended to the right side surface of the multilayer body 22 by the extended line 25C routed on the surface of the same insulating layer as that on which the first planar conductor of the capacitor 25B is disposed, and is connected to the input and output terminal 23B. The second planar conductor included in each of the capacitors 25A and 25B is configured as a ground conductor 29. The ground conductor 29 is connected to the second end SB near the left side of the transverse inductor 24A in the vicinity of the left side surface of the multilayer body 22 and is connected to the second end SB near the right side surface of the transverse inductor 24B in the vicinity of the right side surface of the multilayer body 22.

In that configuration, when the multilayer body 22 is seen from the left side surface or the right side surface along the winding axis CA in a transparent manner, the transverse inductors 24A and 24B are also arranged such that the winding ranges of the transverse inductors 24A and 24B overlap each other. The transverse inductors 24A and 24B are inductively coupled to each other in a direction in which the magnetic fluxes strengthen each other (positively coupled).

The transverse inductors 24A and 24B are arranged such that their first ends SA connected to the input and output terminals 23A and 23B are adjacent to each other in the vicinity of the center of the multilayer body 22. The inductive coupling between the transverse inductors 24A and 24B in that case is weaker than that when the transverse inductors 24A and 24B are arranged such that the first end SA of one of them and the second end SB of the other one are adjacent to each other.

In that configuration, one of the transverse inductors 24A and 24B may also be wound such that the signal propagation direction indicated by the arrows in FIG. 3B is reversed, and thus the transverse inductors 24A and 24B may be inductively coupled to each other in a direction in which their magnetic fluxes weaken each other (negatively coupled). Even when the transverse inductors 24A and 24B are negatively coupled to each other, the degree of the negative coupling is significantly reduced by the arrangement in which the first ends SA near the input and output electrodes 23A and 23B, respectively, are adjacent to each other.

The band pass filter in which the two-stage resonant circuits LC1 and LC2 are coupled between the input and output terminals as described above may be configured. In such a band pass filter, the degree of the inductive coupling between the transverse inductors L1 and L2 being next to each other is set by setting the orientations of both of the ends SA and SB of each of the transverse inductors L1 and L2, and an attenuation pole and a bandwidth in the filter circuit is easily set.

In the above description, an example in which the two-stage resonant circuits LC1 and LC2 are configured in the high frequency component is illustrated. The number of resonant circuits configured in the high frequency component may be one or more than two.

Figure 4:
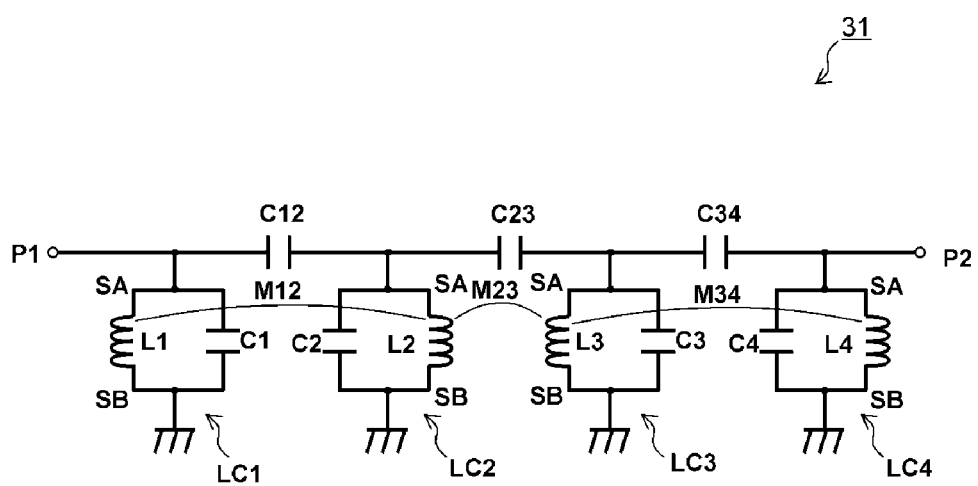
FIG. 4 is an equivalent circuit diagram of a high frequency component according to a third preferred embodiment of the present invention.

Next, a high frequency component 31 according to a third preferred embodiment of the present invention is described. FIG. 4 is an equivalent circuit diagram of the high frequency component 31 according to the third preferred embodiment. The high frequency component 31 defines and functions as a band pass filter including input and output terminals P1 and P2, capacitors C1, C2, C3, C4, C12, C23, and C34, and inductors L1, L2, L3, and L4.

Each of the inductors L1 to L4 includes a first end SA near the input and output terminals P1 and P2 and a second end SB near a ground terminal. The capacitor C1 is connected in parallel to the inductor L1, and they constitute a resonant circuit LC1. Similarly, the capacitor C2 is connected in parallel to the inductor L2, and they constitute a resonant circuit LC2. The capacitor C3 is connected in parallel to the inductor L3, and they constitute a resonant circuit LC3. The capacitor C4 is connected in parallel to the inductor L4, and they constitute a resonant circuit LC4.

The capacitor C12 is connected between the resonant circuits LC1 and LC2. Similarly, the capacitor C23 is connected between the resonant circuits LC2 and LC3. The capacitor C34 is connected between the resonant circuits LC3 and LC4. Each of the capacitors C12, C23, and C34 is a coupling capacitor configured to establish capacitive coupling between two of the resonant circuits LC1 to LC4.

The inductors L1 and L2 in the resonant circuits LC1 and LC2 are inductively coupled to each other. Similarly, the inductors L2 and L3 in the resonant circuits LC2 and LC3 are also inductively coupled to each other. The inductors L3 and L4 in the resonant circuits LC3 and LC4 are inductively coupled to each other.

The resonant circuit LC1 is directly connected to the input terminal P1 and is an input-stage resonant circuit. The resonant circuit LC4 is directly connected to the output terminal P2 and is an output-stage resonant circuit. Each of the resonant circuits LC2 and LC3 is coupled between the resonant circuits LC1 and LC4 and is an intermediate-stage resonant circuit.

The above-described circuitry portion constitutes a band pass filter in which four-stage parallel resonant circuits are coupled between the input and output terminals P1 and P2.

Figure 5:
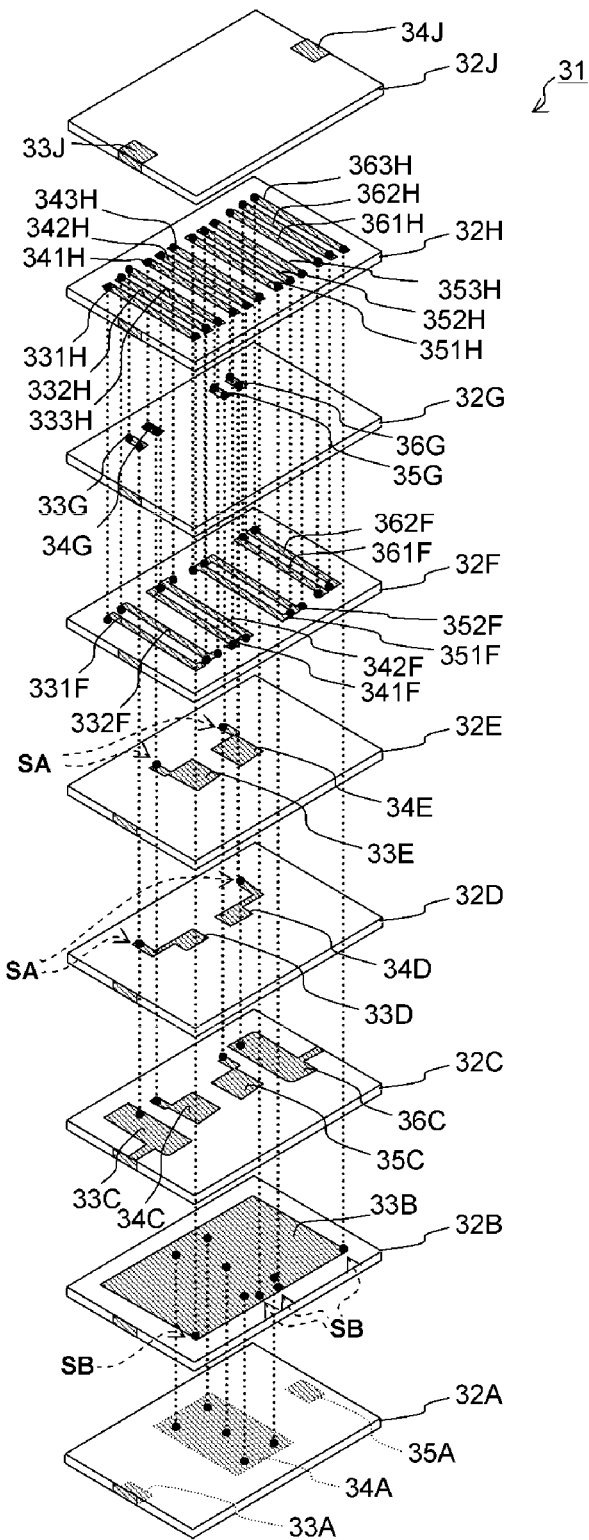
FIG. 5 is an exploded perspective view of the high frequency component according to the third preferred embodiment of the present invention.

FIG. 5 is an exploded perspective view of the high frequency component 31 according to the third preferred embodiment. In the following description, the surface on the near left side of the insulating layers illustrated in FIG. 5 is referred to as the left side surface, the surface on the far right side of the insulating layers is referred to as the right side surface, the surface on the near right side of the insulating layers is referred to as the front surface, and the surface on the far left side of the insulating layers is referred to as the back surface.

The high frequency component 31 includes insulating layers 32A, 32B, 32C, 32D, 32E, 32F, 32G, 32H, and 32J being stacked and constituting a multilayer body having a rectangular or substantially rectangular parallelepiped shape. The insulating layers 32A, 32B, 32C, 32D, 32E, 32F, 32G, 32H, and 32J are stacked in this order from the lower surface toward the upper surface of a multilayer body 32. Planar conductors and linear conductors are disposed on the surfaces of the insulating layers 32A to 32J, and the conductors on different layers are connected with interlayer connection conductors disposed therebetween. Portions of electrodes (not indicated by reference numerals) constituting the input and output terminals P1 and P2 illustrated in FIG. 4 are disposed on the left side surface and the right side surface of each of the insulating layers 32A to 32J.

The insulating layer 32A is exposed at the lower surface of the multilayer body 32. Planar conductors 33A, 34A, and 35A are disposed on the lower surface of the insulating layer 32A in sequence from the left side surface toward the right side surface. The planar conductor 33A is a portion of the electrode constituting the input terminal P1 illustrated in FIG. 4. The planar conductor 34A is the ground terminal. The planar conductor 35A is a portion of the electrode constituting the output terminal P2 illustrated in FIG. 4.

A planar conductor (ground terminal) 33B is disposed on the upper surface of the insulating layer 32B. The ground terminal 33B is connected to the ground terminal 34A, which is on the layer immediately below the insulating layer 32B.

Planar conductors 33C, 34C, 35C, and 36C are disposed on the upper surface of the insulating layer 32C in sequence from the left side surface toward the right side surface. The planar conductor 33C is opposite the ground terminal 33B, which is on the layer immediately below the insulating layer 32C, and they constitute the capacitor C1. The planar conductor 34C is opposite the ground conductor 33B, which is on the layer immediately below the insulating layer 32C, and they constitute the capacitor C2. The planar conductor 35C is opposite the ground conductor 33B, which is on the layer immediately below the insulating layer 32C, and they constitute the capacitor C3. The planar conductor 36C is opposite the ground conductor 33B, which is on the layer immediately below the insulating layer 32C, and they constitute the capacitor C4.

Planar conductors 33D and 34D are disposed on the upper surface of the insulating layer 32D in sequence from the left side surface toward the right side surface. The planar conductor 33D is connected to the planar conductor 33C, which is on the layer immediately below the insulating layer 32D and is opposite the planar conductor 34C, which is on the layer immediately below the insulating layer 32D, and they constitute a part of the coupling capacitor C12. The planar conductor 34D is connected to the planar conductor 36C, which is on the layer immediately below the insulating layer 32D and is opposite the planar conductor 35C, which is on the layer immediately below the insulating layer 32D, and they constitute a portion of the coupling capacitor C34.

Planar conductors 33E and 34E are disposed on the upper surface of the insulating layer 32E in sequence from the left side surface toward the right side surface. The planar conductor 33E is connected to the planar conductor 34C, which is on the layer two layers below the insulating layer 32E and is opposite the planar conductor 33D, which is on the layer immediately below the insulating layer 32E, and they constitute a part of the coupling capacitor C12. The planar conductor 34E is connected to the planar conductor 35C, which is on the layer two layers below the insulating layer 32E, is opposite the planar conductor 34D, which is on the layer immediately below the insulating layer 32E, and they constitute a portion of the coupling capacitor C34.

Linear conductors 331F, 332F, 341F, 342F, 351F, 352F, 361F, and 362F are disposed on the upper surface of the sixth insulating layer 32F in sequence from the left side surface toward the right side surface.

Linear conductors 33G, 34G, 35G, and 36G are disposed on the upper surface of the seventh insulating layer 32G in sequence from the left side surface toward the right side surface. The linear conductor 33G includes an end portion that is near the front surface and connected to the planar conductor 33C, which is on the layer four layers below the insulating layer 32G, and to the planar conductor 33D, which is on the layer three layers below the insulating layer 32G. The linear conductor 34G includes an end portion that is near the front surface and connected to the planar conductor 34C, which is on the layer four layers below the insulating layer 32G, and to the planar conductor 33E, which is on the layer two layers below the insulating layer 32G. The linear conductor 35G includes an end portion that is near the front surface and connected to the planar conductor 35C, which is on the layer four layers below the insulating layer 32G, and to the planar conductor 34E, which is on the layer two layers below the insulating layer 32G. The linear conductor 36G includes an end portion that is near the front surface and connected to the planar conductor 36C, which is on the layer four layers below the insulating layer 32G, and to the planar conductor 34D, which is on the layer three layers below the insulating layer 32G.

Linear conductors 331H, 332H, 333H, 341H, 342H, 343H, 351H, 352H, 353H, 361H, 362H, and 363H are disposed on the upper surface of the eighth insulating layer 32H in sequence from the left side surface toward the right side surface.

The linear conductor 331H includes an end portion that is near the front surface and connected to the ground conductor 33B, which is on the layer six layers below the insulating layer 32H, and another end portion that is near the back surface and connected to the linear conductor 331F, which is on the layer two layers below the insulating layer 32H. The linear conductor 332H includes an end portion that is near the front surface and connected to the linear conductor 331F, which is on the layer two layers below the insulating layer 32H, and another end portion that is near the back surface and connected to the linear conductor 332F, which is on the layer two layers below the insulating layer 32H. The linear conductor 333H includes an end portion that is near the front surface and connected to the linear conductor 332F, which is on the layer two layers below the insulating layer 32H, and another end portion that is near the back surface and connected to the linear conductor 33G, which is on the layer immediately below the insulating layer 32H. Thus, the linear conductors 331H to 333H, the linear conductors 331F and 332F, and the linear conductor 33G, together with the interlayer connection conductors, constitute the inductor (transverse inductor) L1 illustrated in FIG. 4.

The linear conductor 341H includes an end portion that is near the front surface and connected to the linear conductor 341F, which is on the layer two layers below the insulating layer 32H, and another end portion that is near the back surface and connected to the linear conductor 34G, which is on the layer immediately below the insulating layer 32H. The linear conductor 342H includes an end portion that is near the front surface and connected to the linear conductor 342F, which is on the layer two layers below the insulating layer 32H, and another end portion that is near the back surface and connected to the linear conductor 341F, which is on the layer two layers below the insulating layer 32H. The linear conductor 343H includes an end portion that is near the front surface and connected to the ground conductor 33B, which is on the layer six layers below the insulating layer 32H, and another end portion that is near the back surface and connected to the linear conductor 342F, which is on the layer two layers below the insulating layer 32H. Thus, the linear conductors 341H to 343H, the linear conductors 341F and 342F, and the linear conductor 34G, together with the interlayer connection conductors, constitute the inductor (transverse inductor) L2 illustrated in FIG. 4.

The linear conductor 351H includes an end portion that is near the front surface and connected to the ground conductor 33B, which is on the layer six layers below the insulating layer 32H, and another end portion that is near the back surface and connected to the linear conductor 351F, which is on the layer two layers below the insulating layer 32H. The linear conductor 352H includes an end portion that is near the front surface and connected to the linear conductor 351F, which is on the layer two layers below the insulating layer 32H, and another end portion that is near the back surface and connected to the linear conductor 352F, which is on the layer two layers below the insulating layer 32H. The linear conductor 353H includes an end portion that is near the front surface and connected to the linear conductor 352F, which is on the layer two layers below the insulating layer 32H, and another end portion that is near the back surface and connected to the linear conductor 35G, which is on the layer immediately below the insulating layer 32H. Thus, the linear conductors 351H to 353H, the linear conductors 351F and 352F, and the linear conductor 35G, together with the interlayer connection conductors, constitute the inductor (transverse inductor) L3 illustrated in FIG. 4.

The linear conductor 361H includes an end portion that is near the front surface and connected to the linear conductor 361F, which is on the layer two layers below the insulating layer 32H, and another end portion that is near the back surface and connected to the linear conductor 36G, which is on the layer immediately below the insulating layer 32H. The linear conductor 362H includes an end portion that is near the front surface and connected to the linear conductor 362F, which is on the layer two layers below the insulating layer 32H, and another end portion that is near the back surface and connected to the linear conductor 361F, which is on the layer two layers below the insulating layer 32H. The linear conductor 363H includes an end portion that is near the front surface and connected to the ground conductor 33B, which is on the layer six layers below the insulating layer 32H, and another end portion that is near the back surface and connected to the linear conductor 362F, which is on the layer two layers below the insulating layer 32H. Thus, the linear conductors 361H to 363H, the linear conductors 361F and 362F, and the linear conductor 36G, together with the interlayer connection conductors, constitute the inductor (transverse inductor) L4 illustrated in FIG. 4.

The ninth insulating layer 32J is exposed at the upper surface of the multilayer body 32. Planar conductors 33J and 34J are disposed on the upper surface of the insulating layer 32J in sequence from the left side surface toward the right side surface. The planar conductor 33J is a portion of the electrode constituting the input terminal P1 illustrated in FIG. 4. The planar conductor 34J is a portion of the electrode constituting the output terminal P2 illustrated in FIG. 4.

Figure 6A:
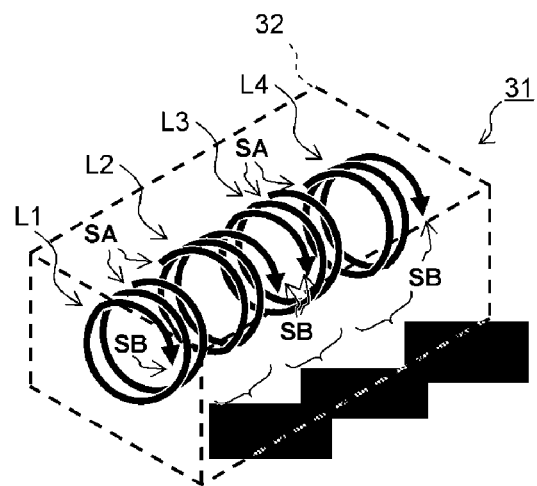
FIGS. 6A and 6B are a schematic perspective view and a side cross-sectional view, respectively, of the high frequency component according to the third preferred embodiment of the present invention.

FIG. 6A is a schematic perspective view that illustrates directions in which the interlayer connection conductors and linear conductors extend from the second end SB toward the first end SA in each of the transverse inductors L1 to L4 in the high frequency component 31. The transverse inductor L1 has a left-handed screw shape (left-handed helical shape) extending from the first end SA located near the right side surface of the multilayer body 32 (near the center of the multilayer body) toward the second end SB located near the left side surface of the multilayer body 32. The transverse inductor L2 has a right-handed screw shape (right-handed helical shape) extending from the first end SA located near the left side surface of the multilayer body 32 toward the second end SB located near the right side surface of the multilayer body 32 (near the center of the multilayer body). The transverse inductor L3 has a left-handed screw shape (left-handed helical shape) extending from the first end SA located near the right side surface of the multilayer body 32 toward the second end SB located near the left side surface of the multilayer body 32 (near the center of the multilayer body). The transverse inductor L4 has a right-handed screw shape (right-handed helical shape) extending from the first end SA located near the left side surface of the multilayer body 32 (near the center of the multilayer body) toward the second end SB located near the right side surface of the multilayer body 32.

Figure 6B:
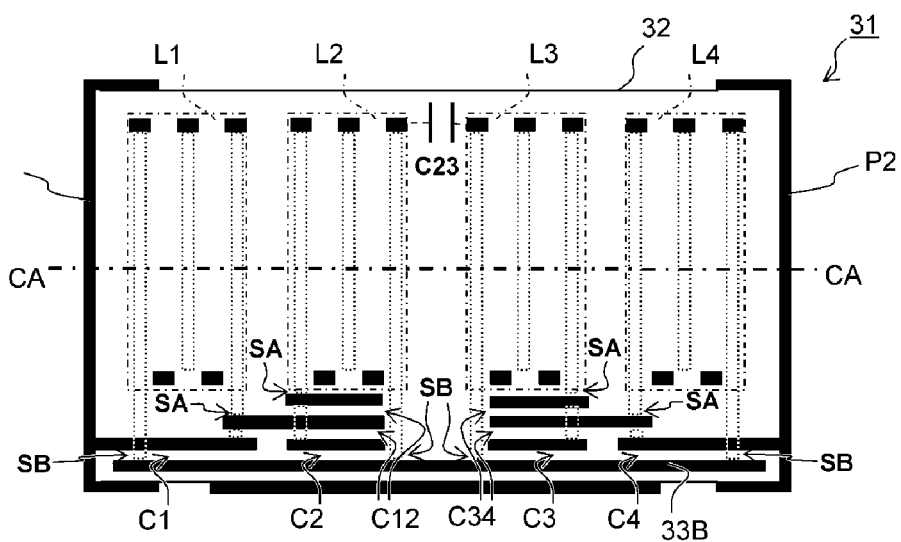

FIG. 6B is a cross-sectional view of the high frequency component 31 and illustrates a cross section of the multilayer body 32 at a plane parallel or substantially parallel to the front surface and the back surface of the multilayer body 32.

The capacitor C1 is arranged below the transverse inductor L1 inside the multilayer body 32, and the first planar conductor is connected to the input terminal P1 on the left side surface of the multilayer body 32. The transverse inductor L1 is connected to the capacitors C1 and C12 and the input terminal P1 at the first end SA on the right side and is directly connected to the ground conductor 33B at the second end SB on the left side.

The capacitor C2 is arranged below the transverse inductor L2 inside the multilayer body 32. The transverse inductor L2 is connected to the capacitors C2 and C12 at the first end SA on the left side and is directly connected to the ground conductor 33B at the second end SB on the right side.

The capacitor C3 is arranged below the transverse inductor L3 inside the multilayer body 32. The transverse inductor L3 is connected to the capacitors C3 and C34 at the first end SA on the right side and is directly connected to the ground conductor 33B at the second end SB on the left side.

The capacitor C4 is arranged below the transverse inductor L4 inside the multilayer body 32, and the first planar conductor is connected to the output terminal P2 on the right side surface of the multilayer body 32. The transverse inductor L4 is connected to the capacitors C4 and C34 and the output terminal P2 at the first end SA on the left side and is directly connected to the ground conductor 33B at the second end SB on the right side.

The coupling capacitor C23 has capacitance produced by the state where the transverse inductors L2 and L3 are adjacent along the winding axis CA and the linear conductors and the interlayer connection conductors in the transverse inductor L2 and the linear conductors and the interlayer connection conductors in the transverse inductor L3 are opposite each other.

In that configuration, when the multilayer body 32 is seen from the left side surface or the right side surface along the winding axis CA in a transparent manner, the transverse inductors L1 to L4 are arranged such that their winding ranges overlap each other. The transverse inductors L1 to L4 are wound such that the linear conductors and the interlayer connection conductors extend from their first ends SA near the input and output terminals P1 and P2 toward the second end SB near the ground conductor in the same direction, and the transverse inductors L1 to L4 are inductively coupled in a direction in which their magnetic fluxes strengthen each other (positively coupled).

The transverse inductors L1 and L2 are arranged such that their first ends SA near the input and output terminals P1 and P2 are adjacent to each other. The transverse inductors L3 and L4 are also arranged such that their first ends SA near the input and output terminals P1 and P2 are adjacent to each other. In contrast, the transverse inductors L2 and L3 are arranged such that their second ends SB near the ground conductor 33B are adjacent to each other. Thus, among the transverse inductors L1, L2, L3, and L4, the inductive couplings between the transverse inductors being next to each other in sequence from the transverse inductor L1 to the transverse inductor L4 are a loose coupling with a low degree, a tight coupling with a high degree, and a loose coupling with a low degree.

In the high frequency component 31, the transverse inductors L1 to L4 including the interlayer connection conductors are also configured as the inductors in the resonant circuits LC1 to LC4, and the filter characteristic (pass band characteristic) of the band pass filter has a high Q value. Because the helical transverse inductors L1 to L4 are used, even when a high inductance is achieved in the transverse inductors L1 to L4, an increase in the dimensions of the multilayer body 32 in the stacking direction is prevented.

In the above-described configuration, because the second planar conductor in each of the capacitors C1 to C4 is configured as the shared ground conductor 33B, the number of the insulating layers in the multilayer body 32 is reduced. Because the first planar conductors in the capacitors C1 to C4 are arranged between the ground conductor 33B and the transverse inductors L1 to L4, respectively, the distance between the ground conductor 33B and each of the transverse inductors L1 to L4 is ensured, and the Q value in each of the resonant circuits LC1 to LC4 including the transverse inductors L1 to L4, respectively, is further improved.

Next, a high frequency component 41 according to a fourth preferred embodiment of the present invention is described. The high frequency component 41 according to the fourth preferred embodiment is a variation of the high frequency component according to the third preferred embodiment.

Figure 7:
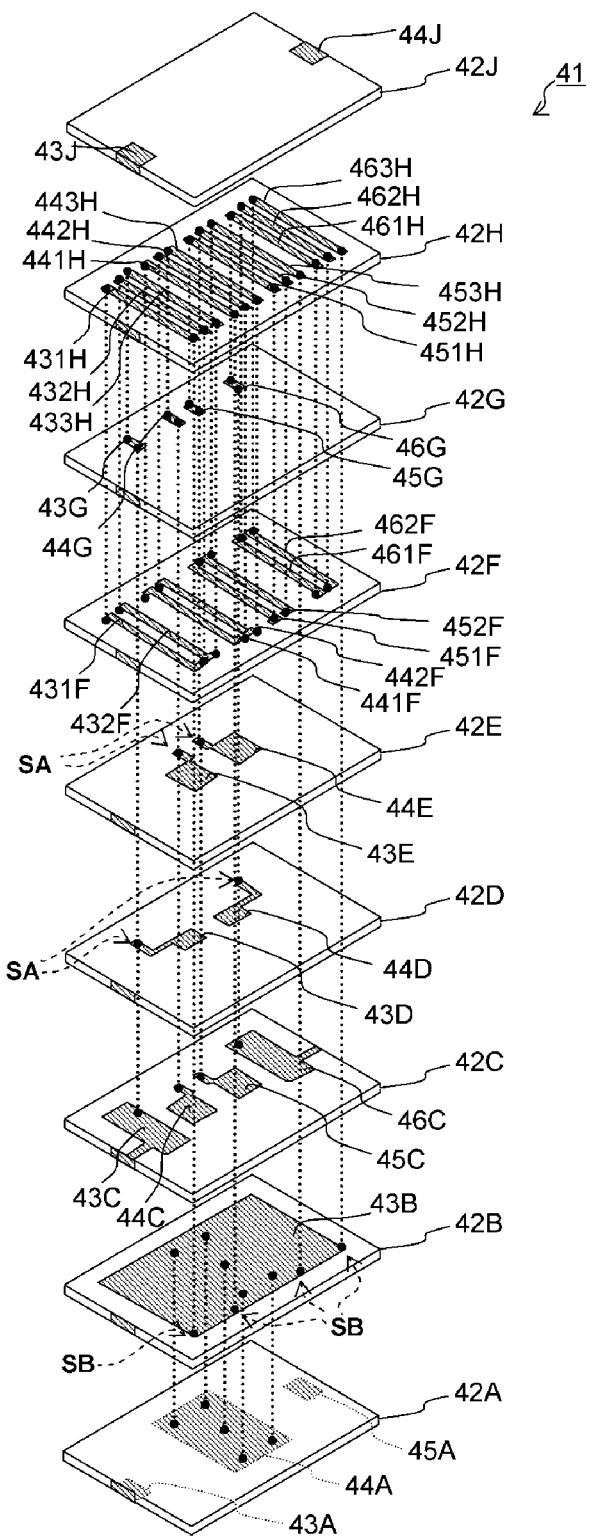
FIG. 7 is an exploded perspective view of a high frequency component according to a fourth preferred embodiment of the present invention.
Figure 8A:
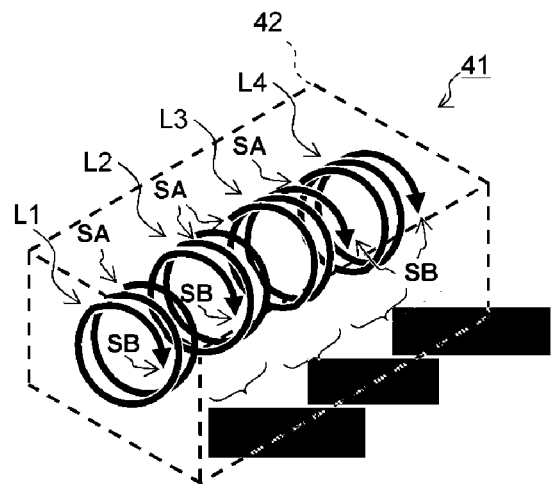
FIGS. 8A and 8B are a schematic perspective view and a side cross-sectional view, respectively, of the high frequency component according to the fourth preferred embodiment of the present invention.
Figure 8B:
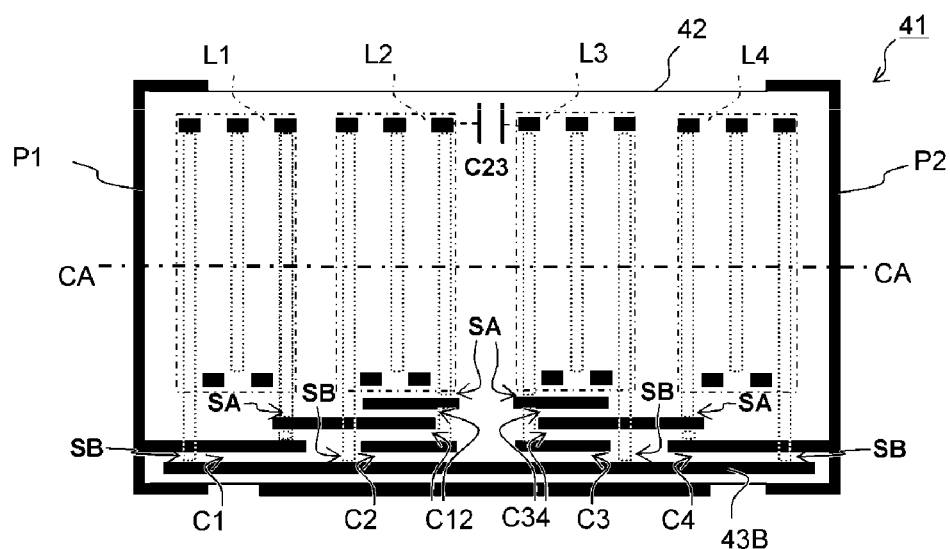

FIG. 7 is an exploded perspective view of the high frequency component 41 according to the fourth preferred embodiment. FIG. 8A is a schematic perspective view that illustrates directions in which the interlayer connection conductors and linear conductors extend from the second end SB toward the first end SA in each of the transverse inductors L1 to L4 in the high frequency component 41. FIG. 8B is a cross-sectional view of the high frequency component 41 and illustrates a cross section of a multilayer body 42 at a plane parallel or substantially parallel to the front surface and the back surface of the multilayer body 42.

As illustrated in FIG. 7, each of planar conductors 44C and 43E and planar conductors 45C and 44E in the high frequency component 41 has a shape different from that of a corresponding planer conductor in the third preferred embodiment, and the connection between the interlayer connection conductor and each of those planar conductors is changed to the location nearer the center of the multilayer body 42.

Each of linear conductors 441F, 442F, 44G, 441H, 442H, and 443H included in the transverse inductor L2 and linear conductors 451F, 452F, 45G, 451H, 452H, and 453H included in the transverse inductor L3 has a shape different from that of a corresponding linear conductor in the third preferred embodiment. Specifically, the transverse inductor L2 has a left-handed screw shape (left-handed helical shape) extending from the first end SA located near the right side surface of the multilayer body 42 (near the center of the multilayer body) toward the second end SB near the left side surface of the multilayer body 42. The transverse inductor L3 has a right-handed screw shape (right-handed helical shape) extending from the first end SA located near the left side surface of the multilayer body 42 (near the center of the multilayer body) toward the second end SB near the right side surface of the multilayer body 42. The location of the interlayer connection conductor constituting each of the first ends SA near the input and output terminals P1 and P2 and the location of the interlayer connection conductor constituting each of the second ends SB near the ground conductor in the transverse inductors L2 and L3 are opposite to those in the third preferred embodiment.

Accordingly, in that configuration, the transverse inductors being next to each other among the transverse inductors L1 to L4 are wound such that the linear conductors and interlayer connection conductors extend from the first end SA near the input and output terminals P1 and P2 toward the second end SB near a ground conductor 43B in the same direction, and they are inductively coupled in a direction in which their magnetic fluxes strengthen each other (positively coupled).

However, in the high frequency component 41, the transverse inductors L1 and L2 are arranged such that the first end SA of the transverse inductor L1 and the second end SB of the transverse inductor L2 are adjacent to each other. The transverse inductors L3 and L4 are also arranged such that the first end SA of the transverse inductor L4 and the second end SB of the transverse inductor L3 are adjacent to each other. Accordingly, each of the inductive coupling between the transverse inductors L1 and L2 and that between the transverse inductors L3 and L4 is neither a tight coupling occurring when the second ends SB are adjacent to each other nor a loose coupling occurring when the first ends SA are adjacent to each other, and is a coupling with a degree intermediate between the tight coupling and the loose coupling (intermediate coupling).

In contrast, the transverse inductors L2 and L3 are arranged such that their first ends SA near the input and output terminals P1 and P2 are adjacent to each other. Thus, the inductive coupling between the transverse inductors L2 and L3 is a loose coupling. Accordingly, in the high frequency component 41, among the transverse inductors L1, L2, L3, and L4, the inductive couplings between the transverse inductors being next to each other in sequence from the transverse inductor L1 to the transverse inductor L4 are an intermediate coupling, a loose coupling, and an intermediate coupling.

The band pass filter in which the four-stage resonant circuits LC1 to LC4 are coupled together between the input and output terminals P1 and P2 as described above may also be configured. In such a band pass filter, the degree of the inductive coupling between the transverse inductors being next to each other among the transverse inductors L1 to L4 preferably is set by setting the orientations of both of the ends SA and SB of each of the transverse inductors L1 to L4 inside the multilayer body, and an attenuation pole and a bandwidth in the filter circuit are easily set.

Next, a filter characteristic (pass band characteristic) of each of the high frequency component 31 according to the third preferred embodiment and the high frequency component 41 according to the fourth preferred embodiment is described.

Figure 9A:
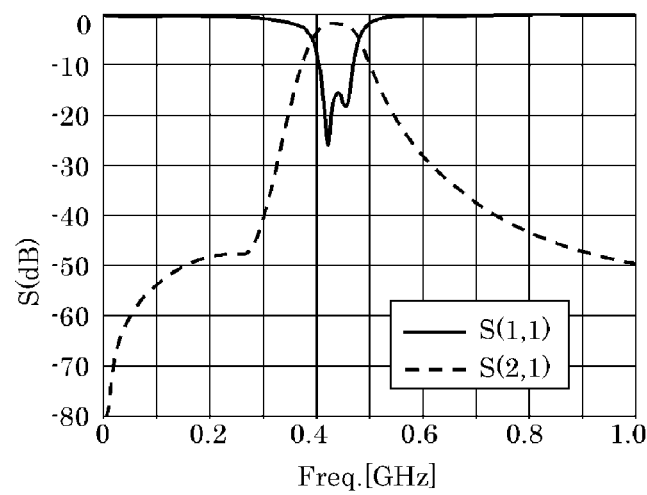
FIGS. 9A and 9B illustrate filter characteristics of the high frequency components according to the third and fourth preferred embodiments of the present invention.
Figure 9B:
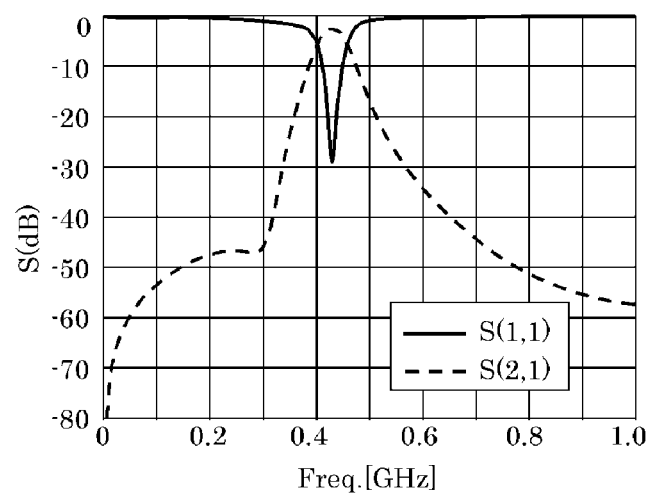

FIG. 9A illustrates an example filter characteristic of the high frequency component 31. FIG. 9B illustrates an example filter characteristic of the high frequency component 41.

As previously described, the high frequency component 31 is one in which the inductive coupling between the input-stage resonant circuit LC1 and the intermediate-stage resonant circuit LC2 and the inductive coupling between the output-stage resonant circuit LC4 and the intermediate-stage LC3 are loose couplings and the inductive coupling between the intermediate-stage resonant circuits LC2 and LC3 is a tight coupling. As in the high frequency component 31, in a band pass filter that includes four or more stages of parallel resonant circuits including input and output stages of parallel resonant circuits and two or more intermediate stages of parallel resonant circuits, the use of a tight coupling in the inductive coupling between the intermediate-stage parallel resonant circuits enables a wide bandwidth in the filter characteristic (pass band characteristic).

The high frequency component 41 is one in which the inductive coupling between the input-stage resonant circuit LC1 and the intermediate-stage resonant circuit LC2 and the inductive coupling between the output-stage resonant circuit LC4 and the intermediate-stage LC3 are intermediate couplings, which are neither tight couplings nor loose couplings, and the inductive coupling between the intermediate-stage resonant circuits LC2 and LC3 is a loose coupling. As in the high frequency component 41, in a band pass filter that includes four or more stages of parallel resonant circuits including input and output stages of parallel resonant circuits and two or more intermediate stages of parallel resonant circuits, the use of a loose coupling in an inductive coupling between intermediate-stage parallel resonant circuits enables a narrow bandwidth in the filter characteristic (pass band characteristic).

Next, a high frequency component 51 according to a fifth preferred embodiment of the present invention is described. The high frequency component 51 according to the fifth preferred embodiment is a variation of the high frequency component according to the third preferred embodiment.

Figure 10A:
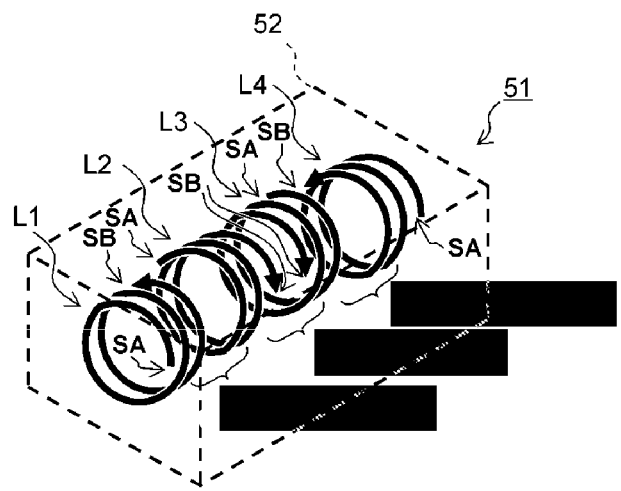
FIG. 10A is a schematic perspective view of a high frequency component according to a fifth preferred embodiment of the present invention.

FIG. 10A is a schematic perspective view that illustrates directions in which the interlayer connection conductors and linear conductors extend from the second end SB toward the first end SA in each of the transverse inductors L1 to L4 in the high frequency component 51.

The high frequency component 51 is one in which the location of the first end SA near the input and output terminals P1 and P2 and the location of the second end SB near the ground conductor in the transverse inductors L1 and L4 included in the input and output stages of the parallel resonant circuits are opposite to those in the high frequency component according to the third preferred embodiment.

In that configuration, the transverse inductors L2 and L3 are wound such that the linear conductors and interlayer connection conductors extend from the first end SA toward the second end SB in the same direction, as indicated by the arrows illustrated in FIG. 10A, and they are inductively coupled to each other in a direction in which their magnetic fluxes strengthen each other (positively coupled). Because the transverse inductors L2 and L3 are arranged such that their second ends SB are adjacent to each other, the degree of the inductive coupling between the transverse inductors L2 and L3 is high.

In contrast, the transverse inductors L1 and L2 are wound such that the linear conductors and interlayer connection conductors extend from the first end SA toward the second end SB in opposite directions, and they are inductively coupled in a direction in which their magnetic fluxes weaken each other (negatively coupled). Because the transverse inductors L1 and L2 are arranged such that the first end SA of the transverse inductor L1 and the second end SB of the transverse inductor L2 are adjacent to each other, they are inductively coupled with a degree intermediate between that in tight coupling and that in loose coupling (intermediately coupled). Similarly, the transverse inductors L4 and L3 are wound such that the linear conductors and interlayer connection conductors extend from the first end SA toward the second end SB in opposite directions, and they are inductively coupled in a direction in which their magnetic fluxes weaken each other (negatively coupled). Because the transverse inductors L4 and L3 are arranged such that the first end SA of the transverse inductor L4 and the second end SB of the transverse inductor L3 are adjacent to each other, they are inductively coupled with a degree intermediate between that in tight coupling and that in loose coupling (intermediately coupled).

Figure 10B:
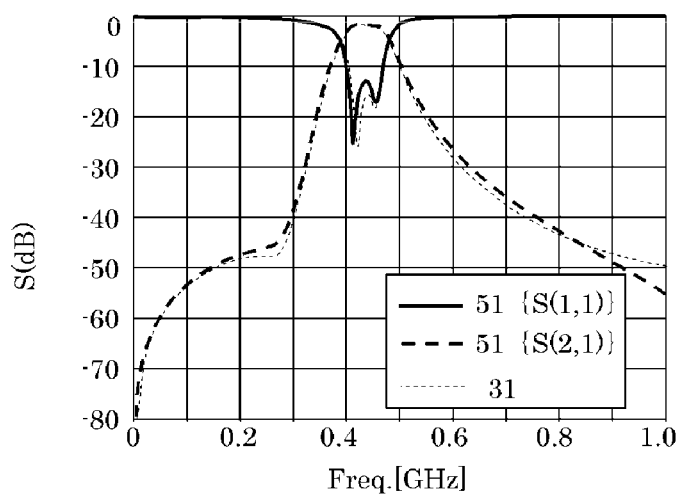
FIG. 10B illustrates a filter characteristic thereof.

FIG. 10B illustrates an example filter characteristic of the high frequency component 51.

As previously described, the high frequency component 51 is one in which the coupling between the intermediate-stage resonant circuits LC2 and LC3 remains unchanged and the inductive coupling between the input-stage resonant circuit LC1 and the intermediate-stage resonant circuit LC2 and the inductive coupling between the output-stage resonant circuit LC4 and the intermediate-stage resonant circuit LC3 are changed to negative couplings and intermediate couplings. Typically, a pass band width in a band pass filter that includes four or more stages of parallel resonant circuits is significantly affected by the degree of inductive coupling between the intermediate-stage parallel resonant circuits and is less affected by the degree of inductive coupling between the intermediate-stage parallel resonant circuit and each of the input-stage and output-stage parallel resonant circuits. Accordingly, the bandwidth in the filter characteristic (pass band characteristic) of the high frequency component 51 is not significantly different from that in the high frequency component according to the third preferred embodiment.

However, the change of the inductive coupling between the intermediate-stage parallel resonant circuit and each of the input-stage and output-stage parallel resonant circuits from a positive coupling to a negative coupling strengthens the capacitive bias in the coupling between the intermediate-stage parallel resonant circuit and each of the input-stage and output-stage parallel resonant circuits. Thus, a coupling capacitor provided between the intermediate-stage parallel resonant circuit and each of the input-stage and output-stage parallel resonant circuits can be one having smaller capacitance. Therefore, the area of the electrodes in the coupling capacitors is significantly reduced, or the coupling capacitors preferably are realized by only capacitance occurring between the intermediate-stage parallel resonant circuit and each of the input-stage and output-stage parallel resonant circuits. Accordingly, a manufacturing process for providing the coupling capacitors and a space for accommodating them in the multilayer body is simplified or eliminated, and the high frequency component 51 is consequently small and inexpensive.

In the fourth preferred embodiment, the first end SA and the second end SB in each of the resonant inductors included in the input-stage and output-stage parallel resonant circuits may also be interchanged. In that case, the coupling capacitor between the intermediate-stage parallel resonant circuit and each of the input-stage and output-stage parallel resonant circuits can be one having smaller capacitance without significantly changing the bandwidth in the filter characteristic (pass band characteristic), as in the above case.

Next, a high frequency component 61 according to a sixth preferred embodiment of the present invention is described. The high frequency component 61 according to the sixth preferred embodiment is a variation of the high frequency component according to the third preferred embodiment.

Figure 11A:
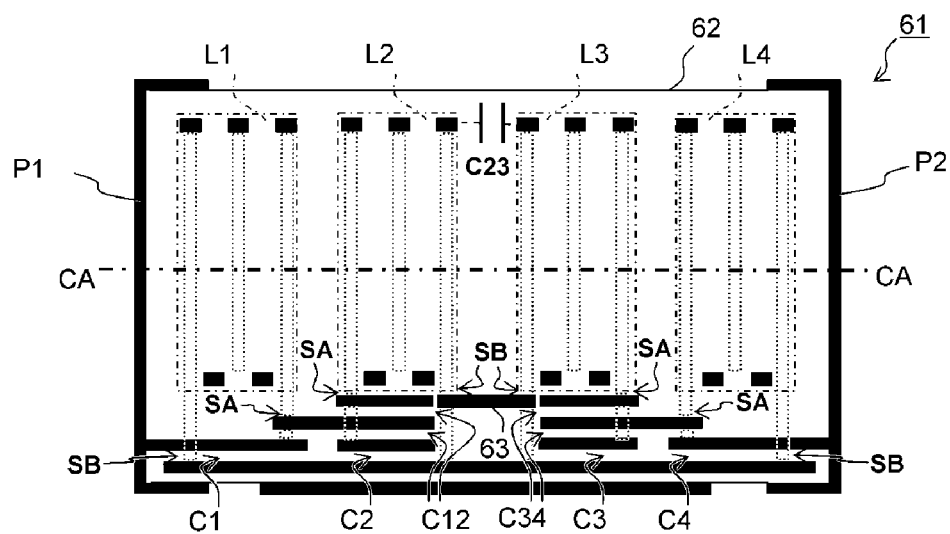
FIG. 11A is a side cross-sectional view of a high frequency component according to a sixth preferred embodiment of the present invention.

FIG. 11A is a side cross-sectional view of the high frequency component 61 and illustrates a cross section of a multilayer body at a plane parallel or substantially parallel to the front surface and the back surface of the multilayer body.

The high frequency component 61 differs from the high frequency component according to the third preferred embodiment in that a shorting conductor 63 configured to strengthen the inductive coupling between the transverse inductors L2 and L3 included in the intermediate-stage parallel resonant circuits is disposed therebetween. The shorting conductor 63 is configured as a linear conductor that connects the second end SB of the transverse inductor L2 near the ground conductor and the second end SB of the transverse inductor L3 near the ground conductor. The inductive coupling between the transverse inductors L2 and L3 is strengthened by the shorting conductor 63. That configuration is not limited to the application to the present preferred embodiment and is also applicable to other preferred embodiments.

Figure 11B:
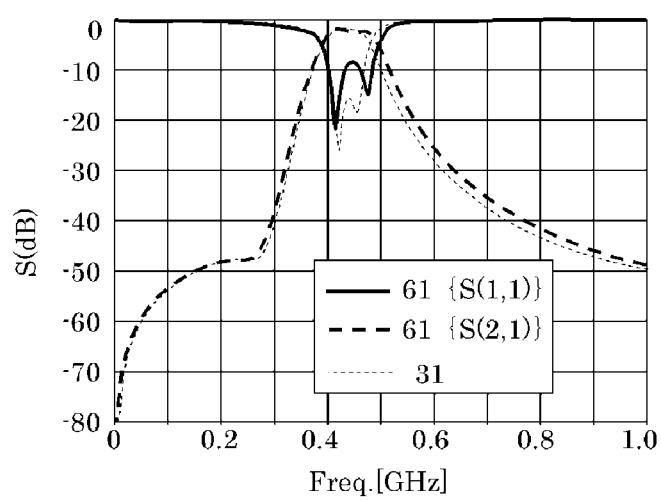
FIG. 11B illustrates a filter characteristic thereof.

FIG. 11B illustrates an example filter characteristic of the high frequency component 61.

As described above, the high frequency component 61 is one in which the inductive coupling between the transverse inductors L2 and L3 is strengthened by the shorting conductor 63. Accordingly, the bandwidth in the filter characteristic (pass band characteristic) in the high frequency component 61 preferably is wider than that in the high frequency component according to the third preferred embodiment.

In the fourth preferred embodiment, if the high frequency component includes the shorting conductor and it strengthens the inductive coupling between the intermediate-stage parallel resonant circuits, the bandwidth in the filter characteristic (pass band characteristic) is also widened.

Next, a high frequency component 71 according to a seventh preferred embodiment of the present invention is described. The high frequency component 71 according to the seventh preferred embodiment is a variation of the high frequency component according to the third preferred embodiment.

Figure 12A:
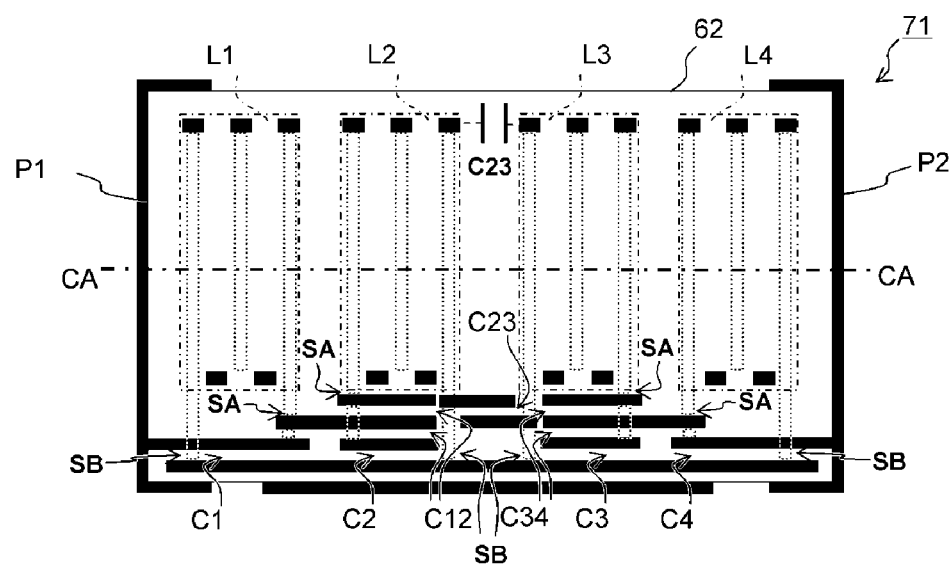
FIG. 12A is a side cross-sectional view of a high frequency component according to a seventh preferred embodiment of the present invention.

FIG. 12A is a side cross-sectional view of the high frequency component 71 and illustrates a cross section of a multilayer body at a plane parallel or substantially parallel to the front surface and the back surface of the multilayer body.

The high frequency component 71 differs from the high frequency component according to the third preferred embodiment in that a coupling capacitor C23 including planar conductors is disposed between the transverse inductors L2 and L3 included in the intermediate-stage parallel resonant circuits and the coupling capacitor C23 is used to suppress the inductive coupling therebetween. The coupling capacitor C23 is one in which an insulating layer is disposed between a planar conductor connected to the second end SB of the transverse inductor L2 near the ground conductor and a planar conductor connected to the second end SB of the transverse inductor L3 near the ground conductor. The coupling capacitor C23 including the planar conductors enables increased capacitance of the coupling capacitor C23 and strengthens the capacitive bias in the coupling between the intermediate-stage parallel resonant circuits. That configuration is not limited to the application to the present preferred embodiment and is also applicable to other preferred embodiments.

Figure 12B:
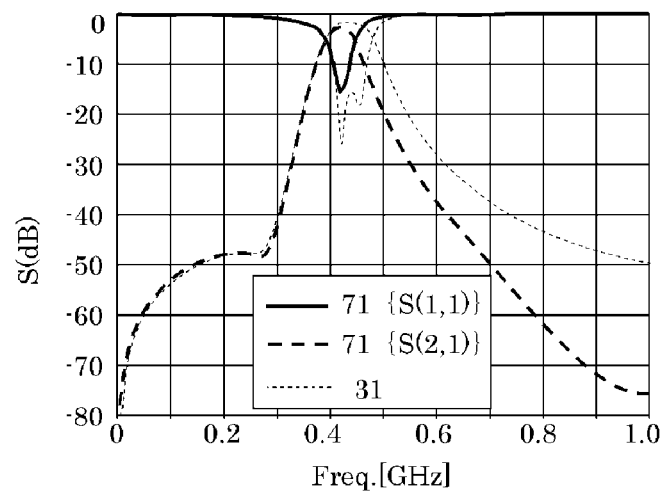
FIG. 12B illustrates a filter characteristic thereof.

FIG. 12B illustrates an example filter characteristic of the high frequency component 71.

As described above, the high frequency component 71 is one in which the coupling capacitor C23 including the planar conductors enables increased capacitance of the coupling capacitor C23 and strengthens the capacitive bias in the coupling between the intermediate-stage parallel resonant circuits. Accordingly, the bandwidth in the filter characteristic (pass band characteristic) in the high frequency component 71 is narrower than that in the high frequency component according to the third preferred embodiment.

In the fourth preferred embodiment, if the high frequency component includes the coupling capacitor including the planar conductors and it strengthens the capacitive coupling between the intermediate-stage parallel resonant circuits, the bandwidth in the filter characteristic (pass band characteristic) is also narrowed.

Next, a high frequency component 81 according to an eighth preferred embodiment of the present invention is described. The high frequency component 81 according to the eighth preferred embodiment is a variation of the high frequency component according to the third preferred embodiment.

Figure 13A:
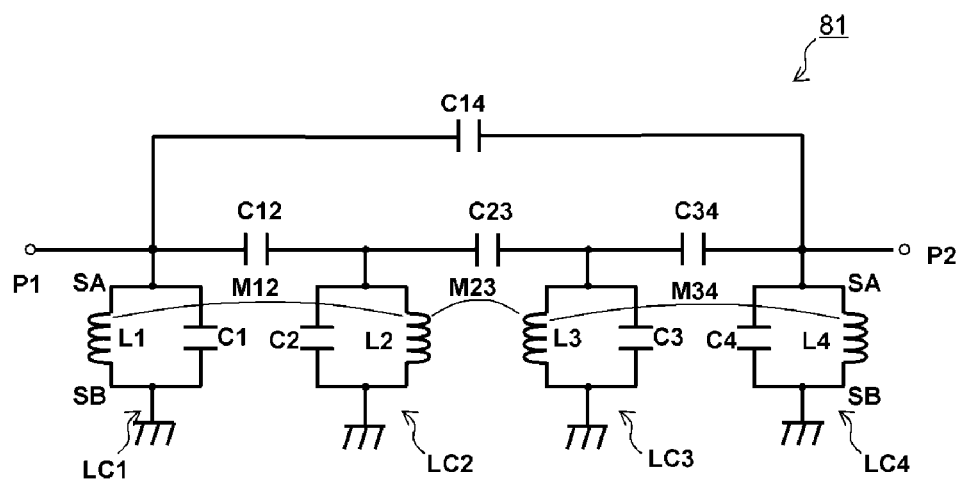
FIG. 13A is an equivalent circuit diagram of a high frequency component according to an eighth preferred embodiment of the present invention.

FIG. 13A is an equivalent circuit diagram of the high frequency component 81.

The high frequency component 81 differs from the high frequency component according to the third preferred embodiment in that a skip-coupling capacitor C14 is disposed between the input-stage resonant circuit LC1 and the output-stage resonant circuit LC4. The skip-coupling capacitor C14 enables setting a filter characteristic with an increased number of attenuation poles. That configuration is not limited to the application to the present preferred embodiment and is also applicable to other preferred embodiments.

Figure 13B:
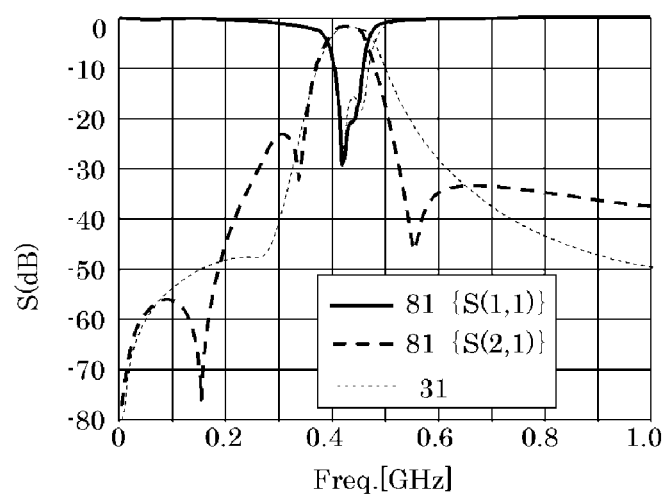
FIG. 13B illustrates a filter characteristic thereof.

FIG. 13B illustrates an example filter characteristic of the high frequency component 81.

As described above, the high frequency component 81 is one in which the skip-coupling capacitor C14 is disposed, the number of attenuation poles in frequencies lower than the pass band is increased, and this makes it easier to achieve a desired bandpass characteristic.

In the fourth preferred embodiment, if the high frequency component includes the skip-coupling capacitor, the number of attenuation poles in frequencies lower than the pass band is increased and a desired bandpass characteristic is easily achieved.

Next, a high frequency component 91 according to a ninth preferred embodiment of the present invention is described. The high frequency component 91 according to the ninth preferred embodiment is a variation of the high frequency component according to the third preferred embodiment.

Figure 14:
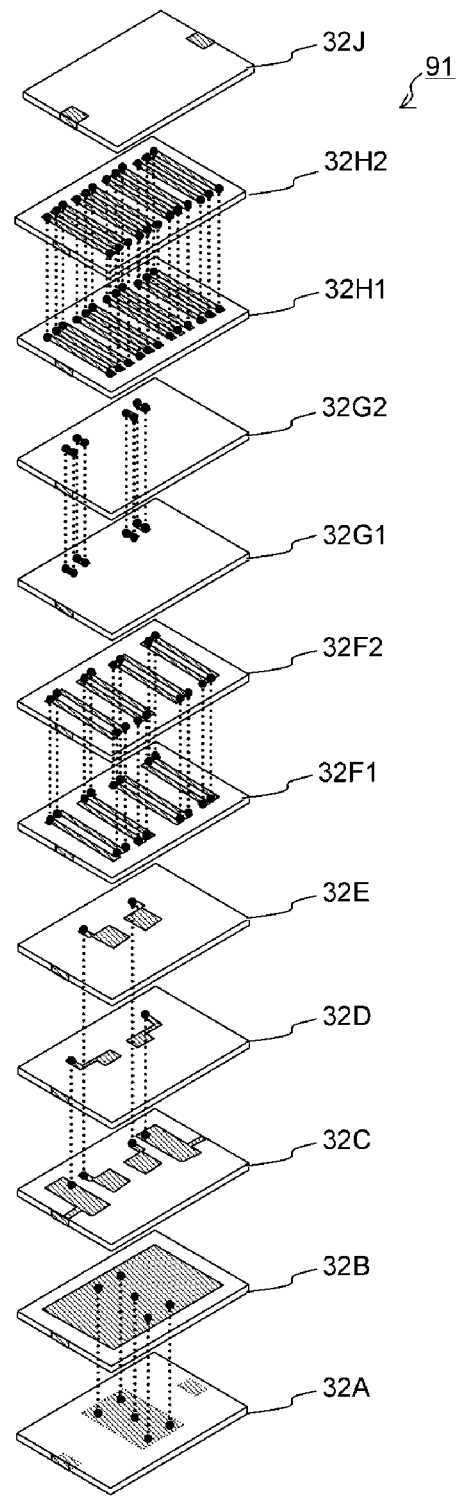
FIG. 14 is an exploded perspective view of a high frequency component according to a ninth preferred embodiment of the present invention.

FIG. 14 is an exploded perspective view of the high frequency component 91 according to the ninth preferred embodiment. Comparison with FIG. 5 clearly reveals that the conductive pattern on the insulating layer 32F in FIG. 5 is configured as conductive patterns on two layers of insulating layers 32F1 and 32F2 in FIG. 14 and the opposed linear conductors in the conductive patterns on the two layers are connected in parallel to each other. Similarly, the conductive pattern on the insulating layer 32G in FIG. 5 is configured as conductive patterns on two layers of insulating layers 32G1 and 32G2 in FIG. 14 and the opposed linear conductors in the conductive patterns on the two layers are connected in parallel to each other. The conductive pattern on the insulating layer 32H in FIG. 5 is configured as conductive patterns on two layers of insulating layers 32H1 and 32H2 in FIG. 14 and the opposed linear conductors in the conductive patterns on the two layers are connected in parallel to each other.

In each of the transverse inductors L1 to L4, the two linear conductors constituting the same turn and being adjacent to each other in the stacking direction are connected in parallel to each other with the interlayer connection conductors. That is, the linear conductors included in the transverse inductor have a multilayer structure, thus increasing the effective cross-sectional area of the linear conductors and reducing the wiring resistance. Accordingly, each of the transverse inductors L1 to L4 included in the resonant circuits LC1 to LC4 have an increased Q value.

Not all of the linear conductors may have a multilayer structure, and only some of the linear conductors may have a multilayer structure. The configuration in which the linear conductors have a multilayer structure is not limited to the application to the present preferred embodiment and is also applicable to other preferred embodiments. In all cases, the effective cross-sectional area of the linear conductors is increased and the wiring resistance is reduced, and thus the Q value of each of the parallel resonant circuits including the transverse inductors is enhanced.

Next, a high frequency component 101 according to a tenth preferred embodiment of the present invention is described. The high frequency component 101 according to the tenth preferred embodiment is a variation of the high frequency component according to the third preferred embodiment.

Figure 15:
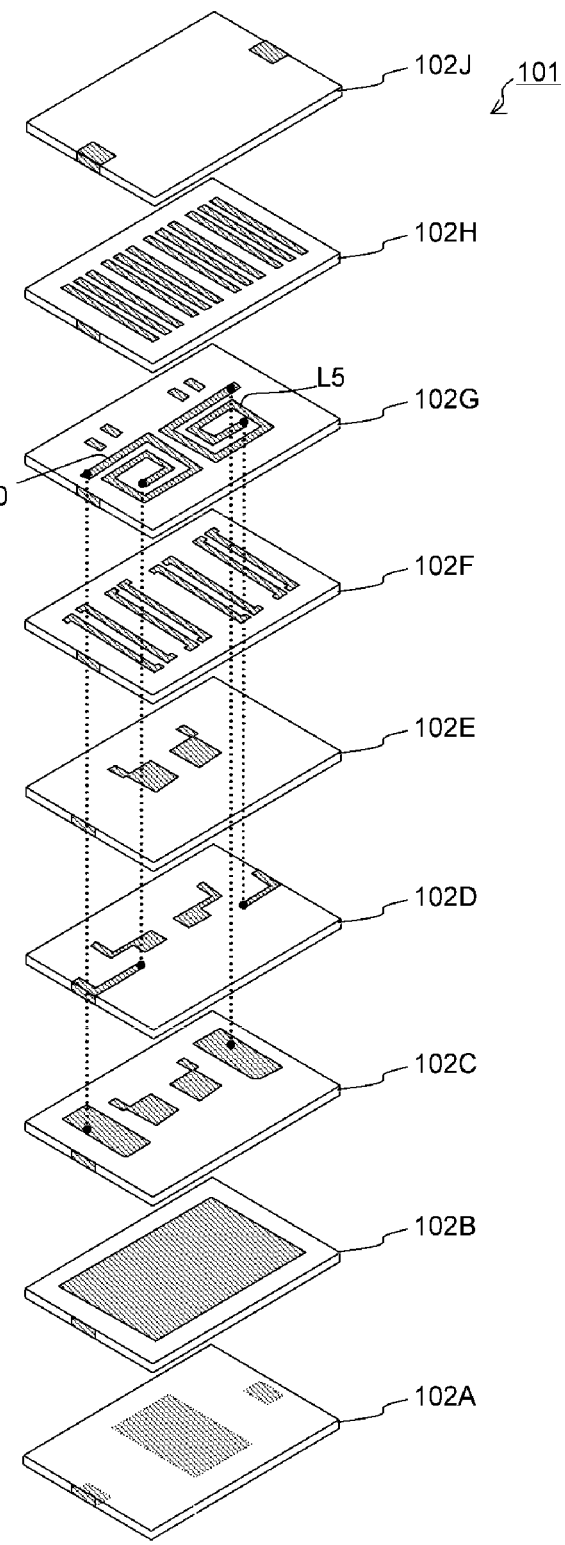
FIG. 15 is an exploded perspective view of a high frequency component according to a tenth preferred embodiment of the present invention.

FIG. 15 is an exploded perspective view of the high frequency component 101 according to the tenth preferred embodiment.

The high frequency component 101 includes inductors L0 and L5. Each of the inductors L0 and L5 includes a helical linear conductor including a plurality of loops on a surface of an insulating layer 102G. The inductor L0 is connected in series between the input terminal P1 and the resonant circuit LC1 in the equivalent circuit illustrated in FIG. 4. The inductor L5 is connected in series between the output terminal P2 and the resonant circuit LC4 in the equivalent circuit illustrated in FIG. 4. In FIG. 15, only via conductors connected to the inductors L0 and L5 are illustrated and other via conductors are omitted. The wiring structure of the other via conductors is the same or substantially the same as that in the high frequency component according to the third preferred embodiment (FIG. 5). The inductors L0 and L5 are used in achieving external inductive coupling through the input and output terminals P1 and P2.

Although the inductors L0 and L5 may be arranged outside the winding ranges of the transverse inductors L1 to L4, they are arranged within the winding ranges of the transverse inductors L1 to L4 here. That arrangement eliminates the need for having a space to accommodate the inductors L0 and L5 outside the winding ranges of the transverse inductors L1 to L4, and that reduces the size of the multilayer body.

In addition to elements configured to achieve external inductive coupling through the input and output terminals P1 and P2, such as the inductors L0 and L5, another element such as a capacitor configured to achieve capacitive external coupling, a coupling capacitor configured to establish capacitive coupling between parallel resonant circuits, and a coupling inductor configured to strengthen inductive coupling between parallel resonant circuits may be arranged within the winding ranges of the transverse inductors L1 to L4.

The configurations in which other inductors and/or capacitors are arranged within the winding ranges of the transverse inductors are not limited to the application to the present preferred embodiment and is also applicable to other preferred embodiments. In all cases, a space configured to accommodate the inductors and capacitors is not needed outside the winding ranges of the transverse inductors L1 to L4, and the multilayer body is small.

The high frequency component according to a preferred embodiment of the present invention is not limited to the numbers of stages of resonant circuits illustrated in the above-described preferred embodiments and may include a larger number of resonant circuits or a smaller number of resonant circuits. The high frequency component may also be configured as a high pass filter, a low pass filter, and a band elimination filter, in addition to the band pass filter and may include any circuitry configuration that includes at least one LC resonant circuit. In any of the above-described preferred embodiments, external coupling between a resonant circuit and each of input and output terminals may be achieved by an inductive coupling through an inductor, by a capacitive coupling through a capacitor, or by a tap coupling using direct wiring. Moreover, the use of an arrangement that achieves at least one tight coupling or loose coupling may be preferable. The combination of degrees of inductive couplings of multiple-stage LC resonant circuits is not limited to ones described above. The inductive couplings may be a positive coupling or a negative coupling. The combination of a positive coupling and a negative coupling in the inductive couplings of multiple-stage LC resonant circuits is not limited to ones described above.

In the case of the configuration including a plurality of stages of LC resonant circuits including at least input-stage, output-stage, and intermediate-stage LC resonant circuits, the transverse inductor included in each of the intermediate-stage LC resonant circuits may preferably be configured such that its linear conductor is wider than that in the transverse inductor included in each of the input-stage and output-stage LC resonant circuits and thus the transverse inductor have a lower resistance. In that case, in particular, the Q value of the transverse inductor at the intermediate-stage is increased, and the insertion loss is significantly reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency component comprising:
   a multilayer body including a plurality of insulating layers stacked on each other;
   planar conductors extending along surfaces of the plurality of insulating layers;
   linear conductors extending along the surfaces of the plurality of insulating layers;
   interlayer connection conductors extending through at least one of the plurality of insulating layers;
   at least one transverse inductor including a first end and a second end, including the linear conductors and the interlayer connection conductors that are connected between the first end and the second end, and being wound along a winding axis direction perpendicular or substantially perpendicular to a stacking direction of the plurality of insulating layers; and
   at least one capacitor including a first planar conductor of the planar conductors directly connected to the first end of the at least one transverse inductor, a second planar conductor of the planar conductors directly connected to the second end of the at least one transverse inductor, and at least one of the plurality of insulating layers that is disposed between the first planar conductor and the second planar conductor; wherein
   the at least one transverse inductor is helical and wound at least more than one turn;
   at least one interlayer connection conductor of the interlayer connection conductors is directly connected to at least one of the linear conductors of the at least one transverse inductor and at least one of the first and second planar conductors of the at least one capacitor; and
   the at least one capacitor is connected to the at least one transverse inductor in parallel.

2. The high frequency component according to claim 1, wherein
   the high frequency component includes a plurality of LC resonant circuits each including an inductor and a capacitor corresponding to the at least one transverse inductor and the at least one capacitor, respectively;
   the winding axis directions in the respective at least one transverse inductor of each LC resonant circuit of the plurality of LC resonant circuits are parallel or substantially parallel to each other; and
   when viewed along the winding axis directions, winding ranges defined by the linear conductors and the interlayer connection conductors overlap each other at least in part.

3. The high frequency component according to claim 2, further comprising:
   input and output terminals and a ground terminal disposed on an outer surface of the multilayer body; wherein
   in at least one set of the transverse inductors being next to each other in the winding axis directions, first ends are connected to the input and output terminals, second ends are connected to the ground terminal and adjacent to each other inside the multilayer body.

4. The high frequency component according to claim 3, further comprising a coupling inductor or a coupling capacitor configured to couple between the plurality of LC resonant circuits or between any one of the plurality of LC resonant circuits and either one of the input and output terminals.

5. The high frequency component according to claim 4, wherein when viewed along the winding axis directions, the coupling inductor or the coupling capacitor is disposed within the winding ranges of the transverse inductors.

6. The high frequency component according to claim 2, further comprising:
   input and output terminals and a ground terminal that are disposed on an outer surface of the multilayer body; wherein
   in at least one set of the transverse inductors being next to each other in the winding axis directions, first ends are connected to the input and output terminals, second ends are connected to the ground terminal, and the first ends are adjacent to each other inside the multilayer body.

7. The high frequency component according to claim 2, wherein external coupling between the plurality of LC resonant circuits or between any one of the plurality of LC resonant circuits and one of an input terminal and an output terminal is provided by at least one of an inductive coupling through an inductor, a capacitive coupling through a capacitor, and a tap coupling through direct wiring.

8. The high frequency component according to claim 1, wherein the first planar conductor or the second planar conductor is disposed on a surface of a same one of the plurality of insulating layers as that on which one of the linear conductors of the at least one transverse inductor is disposed.

9. The high frequency component according to claim 1, wherein the linear conductors are disposed on two or more of the plurality of insulating layers such that the linear conductors overlap each other when viewed along the stacking direction of the plurality of insulating layers, and the linear conductors are connected in parallel to each other through the interlayer connection conductors.

10. The high frequency component according to claim 1, wherein the insulating layer located between the first planar conductor and the second planar conductor has a relative permittivity higher than that of another one of the plurality of insulating layers.

11. The high frequency component according to claim 1, wherein the at least one transverse inductor has a right-handed screw shape.

12. The high frequency component according to claim 1, wherein the at least one transverse inductor has a left-handed screw shape.

13. The high frequency component according to claim 1, wherein the at least one transverse inductor includes a first transverse inductor having a left-handed screw shape and a second transverse inductor having a left-handed screw shape.

14. The high frequency component according to claim 1, wherein the high frequency component is one of a band pass filter, a high pass filter, a low pass filter, and a band elimination filter.

15. The high frequency component according to claim 1, wherein
- the second planar conductor is a ground conductor electrically connected to the ground terminal and is opposite to the at least one transverse inductor; and
- the first planar conductor is disposed between the at least one transverse inductor and the second planar conductor inside the multilayer body.

* * * * *